(12) United States Patent
Otsuka et al.

(10) Patent No.: US 10,985,132 B2
(45) Date of Patent: *Apr. 20, 2021

(54) BONDING APPARATUS, BONDING SYSTEM, BONDING METHOD AND STORAGE MEDIUM

(71) Applicant: TOKYO ELECTRON LIMITED, Tokyo (JP)

(72) Inventors: Yoshitaka Otsuka, Koshi (JP); Takashi Nakamitsu, Koshi (JP); Yosuke Omori, Koshi (JP); Kenji Sugakawa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/928,814

(22) Filed: Jul. 14, 2020

(65) Prior Publication Data

US 2020/0343216 A1 Oct. 29, 2020

Related U.S. Application Data

(63) Continuation of application No. 16/553,530, filed on Aug. 28, 2019, which is a continuation of application
(Continued)

(30) Foreign Application Priority Data

Dec. 1, 2016 (JP) .............................. JP2016-233985

(51) Int. Cl.
*B32B 41/00* (2006.01)
*H01L 23/00* (2006.01)
(Continued)

(52) U.S. Cl.
CPC .............. *H01L 24/75* (2013.01); *B32B 15/01* (2013.01); *H01L 21/187* (2013.01);
(Continued)

(58) Field of Classification Search
CPC .............. H01L 24/75; H01L 21/67742; H01L 21/67092; H01L 24/83; H01L 21/67253;
(Continued)

(56) References Cited

U.S. PATENT DOCUMENTS 10,438,920 B2 * 10/2019 Otsuka .............. H01L 21/67259
2015/0017782 A1 1/2015 Akiyama et al.
(Continued)

FOREIGN PATENT DOCUMENTS

JP 2011-205074 A 10/2011
JP 2012-156163 A 8/2012
(Continued)

*Primary Examiner* — Michael N Orlando
*Assistant Examiner* — Joshel Rivera
(74) *Attorney, Agent, or Firm* — Nath, Goldberg & Meyer; Jerald L. Meyer

(57) ABSTRACT

There is provided a bonding apparatus for bonding substrates together, which includes: a first holding part configured to adsorptively hold a first substrate by vacuum-drawing the first substrate on a lower surface of the first substrate; a second holding part provided below the first holding part and configured to adsorptively hold a second substrate by vacuum-drawing the second substrate on an upper surface of the second substrate; a pressing member provided in the first holding part and configured to press a central portion of the first substrate; and a plurality of substrate detection parts provided in the first holding part and configured to detect a detachment of the first substrate from the first holding part.

14 Claims, 14 Drawing Sheets

Related U.S. Application Data

No. 15/822,364, filed on Nov. 27, 2017, now Pat. No. 10,438,920.

(51) Int. Cl.
| | |
|---|---|
| *H01L 21/677* | (2006.01) |
| *H01L 21/67* | (2006.01) |
| *H01L 21/683* | (2006.01) |
| *B32B 15/01* | (2006.01) |
| *H01L 21/18* | (2006.01) |
| *H01L 21/20* | (2006.01) |
| *H01L 21/68* | (2006.01) |
| *B32B 37/10* | (2006.01) |
| *B32B 37/00* | (2006.01) |

(52) U.S. Cl.
CPC .... H01L 21/2007 (2013.01); H01L 21/67092 (2013.01); H01L 21/67253 (2013.01); H01L 21/67259 (2013.01); H01L 21/67742 (2013.01); H01L 21/68 (2013.01); H01L 21/6838 (2013.01); H01L 24/80 (2013.01); H01L 24/83 (2013.01); *B32B 37/0046* (2013.01); *B32B 37/10* (2013.01); *B32B 41/00* (2013.01); *B32B 2041/04* (2013.01); *B32B 2457/14* (2013.01); *H01L 2224/753* (2013.01); *H01L 2224/7515* (2013.01); *H01L 2224/7531* (2013.01); *H01L 2224/7555* (2013.01); *H01L 2224/7565* (2013.01); *H01L 2224/75302* (2013.01); *H01L 2224/75305* (2013.01); *H01L 2224/75744* (2013.01); *H01L 2224/75745* (2013.01); *H01L 2224/75901* (2013.01); *H01L 2224/75981* (2013.01); *H01L 2224/75986* (2013.01); *H01L 2224/80009* (2013.01); *H01L 2224/80201* (2013.01); *H01L 2224/80894* (2013.01); *H01L 2224/80908* (2013.01); *H01L 2224/83009* (2013.01); *H01L 2224/83201* (2013.01); *H01L 2224/83894* (2013.01); *H01L 2224/83908* (2013.01)

(58) Field of Classification Search
CPC . H01L 21/67259; H01L 21/68; H01L 21/187; H01L 21/6838; H01L 21/2007; H01L 24/80; H01L 2224/75981; H01L 2224/83894; H01L 2224/75901; H01L 2224/7555; H01L 2224/75986; H01L 2224/75745; H01L 2224/7565; H01L 2224/80009; H01L 2224/75302; H01L 2224/753; H01L 2224/80894; H01L 2224/83201; H01L 2224/83908; H01L 2224/80908; H01L 2224/80201; H01L 2224/75744; H01L 2224/7515; B32B 15/01; B32B 2041/04; B32B 41/00; B32B 2457/14; B32B 37/0046
USPC .......... 156/64, 350, 351, 378, 379
See application file for complete search history.

(56) References Cited

U.S. PATENT DOCUMENTS

2018/0158796 A1 6/2018 Otsuka et al.
2019/0385973 A1* 12/2019 Otsuka ................... H01L 21/68

FOREIGN PATENT DOCUMENTS

| JP | 2012-175043 A | 9/2012 |
|---|---|---|
| JP | 2016-39364 A | 3/2016 |

* cited by examiner

BONDING APPARATUS, BONDING SYSTEM, BONDING METHOD AND STORAGE MEDIUM

CROSS-REFERENCE TO RELATED APPLICATION

This is a Continuation Application of U.S. patent application Ser. No. 16/553,530, filed Aug. 28, 2019, which is a Continuation of U.S. patent application Ser. No. 15/822,364, filed Nov. 27, 2017, an application claiming the benefit from Japanese Application No. 2016-233985, filed Dec. 1, 2016, the contents of each of which are hereby incorporated by reference in their entirety.

TECHNICAL FIELD

The present disclosure relates to a bonding apparatus for bonding substrates together, a bonding system provided with the bonding apparatus, a bonding method using the bonding apparatus and a non-transitory computer-readable storage medium.

BACKGROUND

In recent years, high integration of semiconductor devices has been advanced. In a case where a plurality of highly integrated semiconductor devices is arranged in a horizontal plane and is connected by wires for production, there is a concern that the wiring length is increased, the resistance of wires is increased, and the wiring delay is large.

Under the circumstances, there has been proposed the use of a three-dimensional integration technology that three-dimensionally stacks semiconductor devices. In this three-dimensional integration technology, two semiconductor wafers (hereinafter referred to as "wafers") are bonded through the use of, e.g., a conventional bonding system. For example, the bonding system includes a surface modifying apparatus for modifying a surface of a wafer to be bonded, a surface hydrophilizing apparatus for hydrophilizing the surface of the wafer modified with the surface modifying apparatus, and a bonding apparatus for bonding the wafers whose surfaces are hydrophilized with the surface hydrophilizing apparatus. According to this bonding system, in the surface modifying apparatus, plasma treatment is performed on the surface of the wafer to modify the surface of the wafer. In the surface hydrophilizing apparatus, pure water is supplied to the surface of the wafer to hydrophilize the surface of the wafer. Thereafter, in the bonding apparatus, the wafers are bonded to each other by virtue of a van der Waals force and a hydrogen bond (intermolecular force).

The bonding apparatus includes an upper chuck configured to hold one wafer (hereinafter referred to as "upper wafer") on the lower surface thereof, a lower chuck installed under the upper chuck and configured to hold another wafer (hereinafter referred to as "lower wafer") on the upper surface thereof, and a pressing member provided in the upper chuck and configured to press the central portion of the upper wafer. In such a bonding apparatus, in a state in which the upper wafer held by the upper chuck and the lower wafer held by the lower chuck are disposed to face each other, the central portion of the upper wafer and the central portion of the lower wafer are pressed and brought into contact with each other by the pressing member, whereby the central portions are bonded to each other to form a bonding area. Thereafter, a so-called bonding wave occurs in which the bonding area expands from the central portion of the wafer to the outer peripheral portion thereof. Thus, the upper wafer and the lower wafer are bonded.

In order to suppress distortion of the laminated wafer after bonding, it is preferable that the bonding wave is uniformly (i.e., concentrically) expanded from the central portion of the wafer toward the outer peripheral portion thereof. However, in the bonding apparatus described above, the bonding wave is not monitored. Therefore, even if the bonding wave is unevenly expanded, it is not possible to grasp such an uneven expansion. Accordingly, there is room for improvement in the wafer bonding process of the related art.

SUMMARY

Some embodiments of the present disclosure provide a technique capable of inspecting a state of a bonding process of substrates and appropriately performing the bonding process.

According to one embodiment of the present disclosure, there is provided a bonding apparatus for bonding substrates together, including: a first holding part configured to adsorptively hold a first substrate by vacuum-drawing the first substrate on a lower surface of the first substrate; a second holding part provided below the first holding part and configured to adsorptively hold a second substrate by vacuum-drawing the second substrate on an upper surface of the second substrate; a pressing member provided in the first holding part and configured to press a central portion of the first substrate; and a plurality of substrate detection parts provided in the first holding part and configured to detect a detachment of the first substrate from the first holding part.

According to another embodiment of the present disclosure, there is provided a bonding system provided with the bonding apparatus of claim 1, which includes: a processing station provided with the bonding apparatus; and a loading/unloading station configured to hold a plurality of first substrates, a plurality of second substrates or a plurality of laminated substrates each of which is obtained by bonding the first substrate and the second substrate, and configured to load and unload the plurality of first substrates, the plurality of second substrates or the plurality of laminated substrates into and from the processing station, wherein the processing station includes: a surface modifying apparatus configured to modify a surface of the first substrate or the second substrate to be bonded; a surface hydrophilizing apparatus configured to hydrophilize the surface of the first substrate or the surface of the second substrate modified by the surface modifying apparatus; and a transfer device configured to transfer the plurality of first substrates, the plurality of second substrates or the plurality of laminated substrates to the surface modifying apparatus, the surface hydrophilizing apparatus and the bonding apparatus, and wherein the bonding apparatus is configured to bond the first substrate and the second substrate whose surfaces are hydrophilized by the surface hydrophilizing apparatus.

According to another embodiment of the present disclosure, there is provided a bonding method for bonding substrates together, which includes: arranging a first substrate held on a lower surface of a first holding part and a second substrate held on an upper surface of a second holding part so as to face each other; subsequently, lowering a pressing member provided in the first holding part and configured to press a central portion of the first substrate, and causing the pressing member to press and bring the central portion of the first substrate and a central portion of the second substrate into contact with each other; and subsequently, sequentially bonding the first substrate and the second substrate from the central portion of the first substrate toward an outer peripheral portion of the first substrate in a state in which the central portion of the first substrate and the central portion of the second substrate are in contact with each other, wherein the bonding the first substrate and the second substrate includes detecting a detachment of the first substrate from the first holding part and inspecting a state of a bonding process, using a plurality of substrate detection parts provided in the first holding part.

According to another embodiment of the present disclosure, there is provided a non-transitory computer-readable storage medium storing a program that operates on a computer of a control part configured to control a bonding apparatus so that the aforementioned bonding method is executed by the bonding apparatus.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Embodiments of the present disclosure will be described below with reference to the accompanying drawings. It should be noted that the present disclosure is not limited by the embodiments described below. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

1. Configuration of Bonding System

Figure 1:
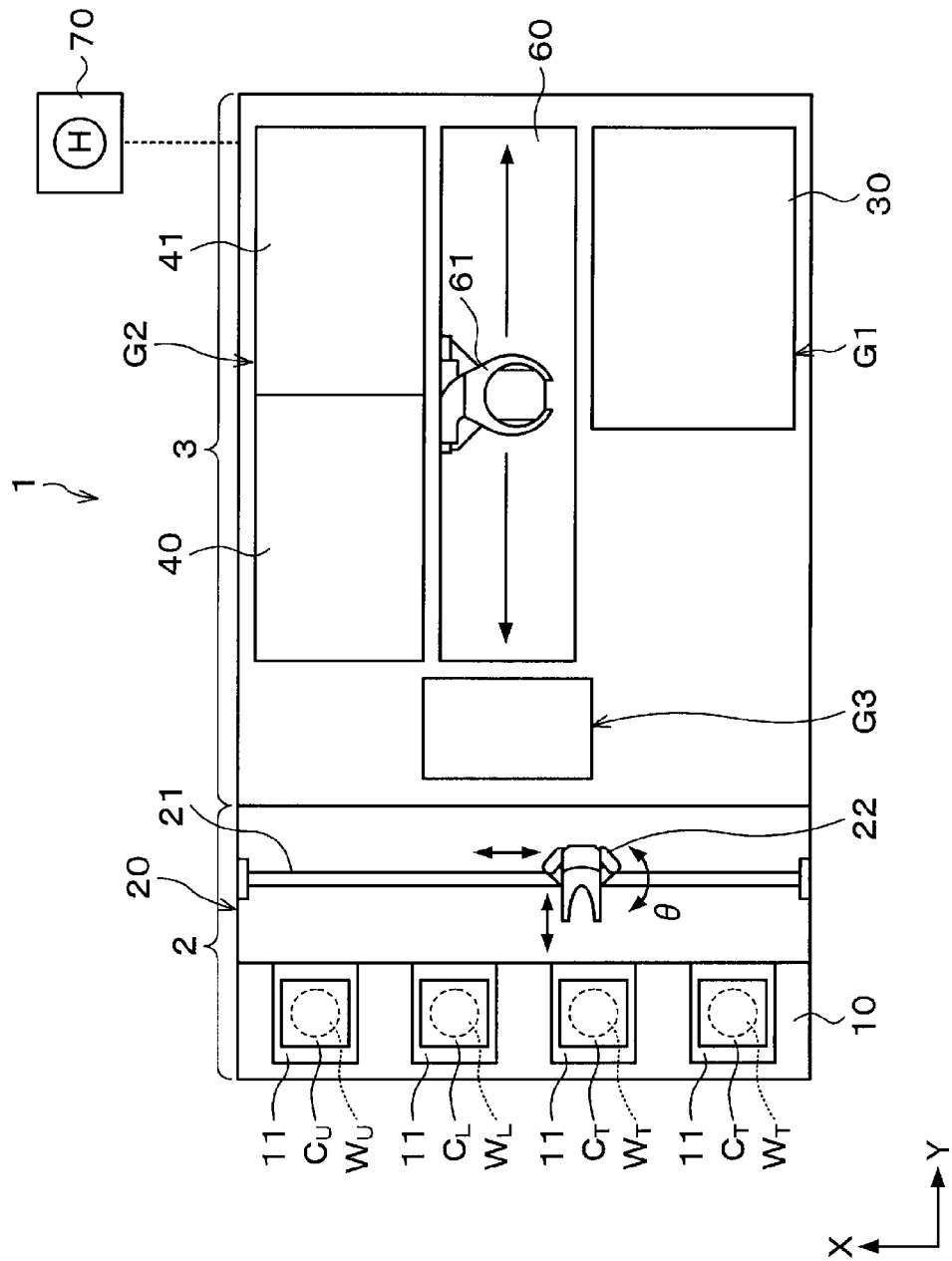
FIG. 1 is a plan view schematically showing a configuration of a bonding system according to an embodiment.
Figure 2:
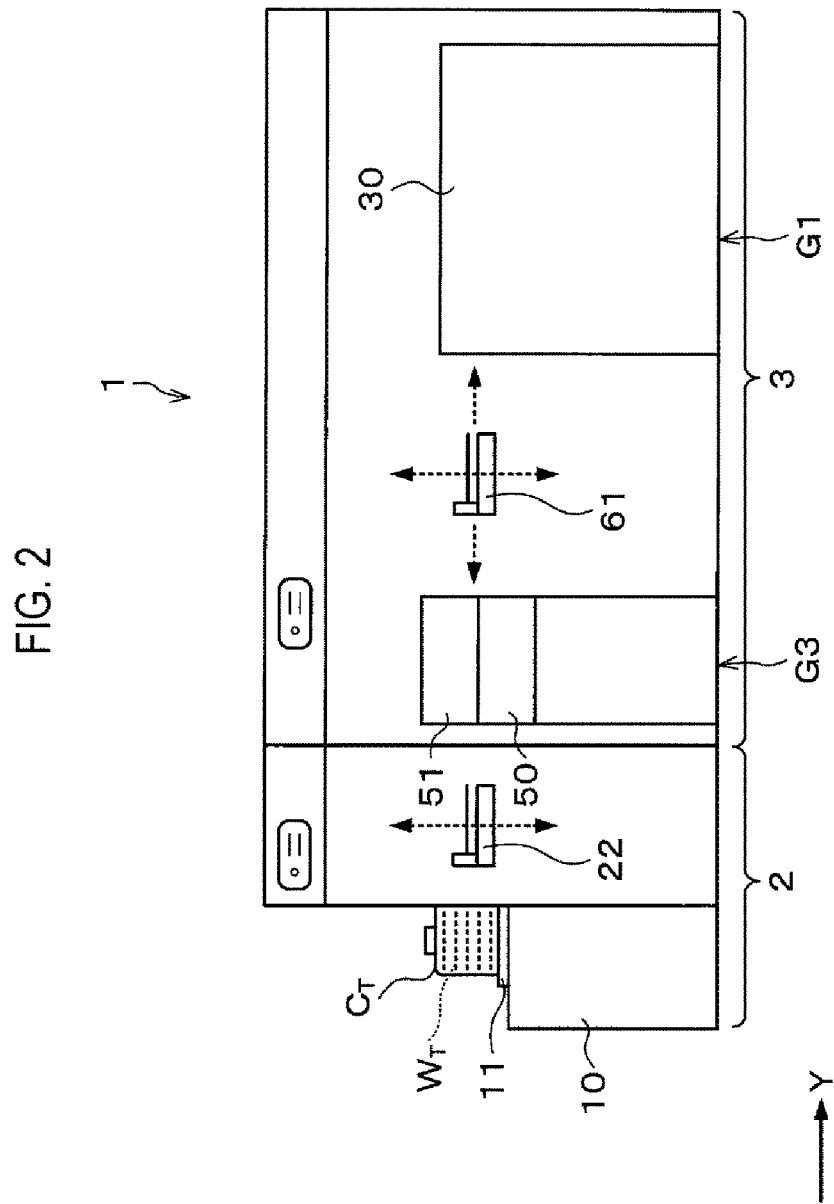
FIG. 2 is a side view schematically showing an internal configuration of a bonding system according to an embodiment.

First, a configuration of a bonding system according to the present embodiment will be described. FIG. 1 is a plan view schematically showing the configuration of the bonding system 1. FIG. 2 is a side view schematically showing an internal configuration of the bonding system 1.

Figure 3:
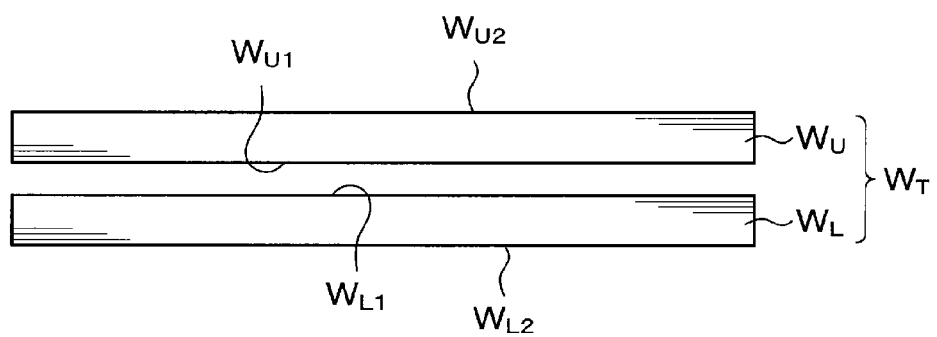
FIG. 3 is a side view schematically showing configurations of an upper wafer and a lower wafer.

In the bonding system 1, as shown in FIG. 3, for example, two wafers $W_U$ and $W_L$ as substrates are bonded to each other. Hereinafter, the wafer arranged at the upper side is referred to as "upper wafer $W_U$" as a first substrate, and the wafer arranged at the lower side is referred to as "lower wafer $W_L$" as a second substrate. Furthermore, a surface of the upper wafer $W_U$ to be bonded is referred to as a "front surface $W_{U1}$", and a surface opposite to the front surface $W_{U1}$ is referred to as a "back surface $W_{U2}$". Similarly, a surface of the lower wafer $W_L$ to be bonded is referred to as a "front surface $W_{L1}$", and a surface opposite to the front surface $W_{L1}$ is referred to as a "back surface $W_{L2}$". In the bonding system 1, the upper wafer $W_U$ and the lower wafer $W_L$ are bonded to form a laminated wafer $W_T$ as a laminated substrate.

As shown in FIG. 1, the bonding system 1 includes, for example, a loading/unloading station 2 in which cassettes $C_U$, $C_L$ and CT each capable of accommodating a plurality of wafers $W_U$ and $W_L$ and a plurality of laminated wafers $W_T$ are loaded and unloaded with respect to the outside, and a processing station 3 provided with various processing apparatuses for performing predetermined processes on the wafers $W_U$ and $W_L$ and the laminated wafers $W_T$. The loading/unloading station 2 and the processing station 3 are integrally connected to each other.

In the loading/unloading station 2, there is provided a cassette mounting table 10. On the cassette mounting table 10, a plurality of, for example, four, cassette mounting plates 11 are provided. The cassette placing plates 11 are arranged in a line along an X-direction (up-down direction in FIG. 1) which is a horizontal direction. On the cassette mounting plates 11, the cassettes $C_U$, $C_L$ and $C_T$ can be mounted when the cassettes $C_U$, $C_L$ and $C_T$ are loaded and unloaded with respect to the outside of the bonding system 1. In this way, the loading/unloading station 2 is configured to hold a plurality of upper wafers $W_U$, a plurality of lower wafers $W_L$ and a plurality of laminated wafers $W_T$. The number of the cassette mounting plates 11 is not limited to that of the present embodiment and may be arbitrarily set. One of the cassettes may be used for recovering abnormal wafers. That is to say, one of the cassettes may be a cassette that can separate the wafers having an abnormality occurring when bonding the upper wafer $W_U$ and the lower wafer $W_L$ due to various factors from other normal laminated wafers $W_T$. In the present embodiment, one cassette $C_T$ out of a plurality of cassettes $C_T$ is used to recover abnormal wafers, and other cassettes $C_T$ are used to accommodate normal laminated wafers $W_T$.

In the loading/unloading station 2, a wafer transfer part 20 is provided adjacent to the cassette mounting table 10. In the wafer transfer part 20, there is provided a wafer transfer device 22 movable along a transfer path 21 extending in the X-direction. The wafer transfer device 22 is also movable in a vertical direction and about a vertical axis (in a θ direction). The wafer transfer device 22 is capable of transferring the wafers $W_U$ and $W_L$ and the laminated wafers $W_T$ between the cassettes $C_U$, $C_L$ and $C_T$ on the respective cassette mounting plates 11 and transition devices 50 and 51 of a third processing block G3 of the processing station 3 to be described later.

In the processing station 3, there are provided a plurality of, for example, three, processing blocks G1, G2 and G3 including various devices. For example, a first processing block G1 is provided at a front surface side (in the negative X-direction in FIG. 1) of the processing station 3, and a second processing block G2 is provided at a back surface side (in the positive X-direction in FIG. 1) of the processing station 3. A third processing block G3 is provided at the side of the loading/unloading station 2 (in the negative Y-direction in FIG. 1) of the processing station 3.

For example, in the first processing block G1, a surface modifying apparatus 30 for modifying the surfaces $W_{U1}$ and $W_{L1}$ of the wafers $W_U$ and $W_L$ is arranged. In the surface modifying apparatus 30, for example, an oxygen gas or a nitrogen gas as a processing gas is excited, plasmarized and ionized in a depressurized atmosphere. The oxygen ions or nitrogen ions are irradiated onto the surfaces $W_{U1}$ and $W_{L1}$, whereby the surfaces $W_{U1}$ and $W_{L1}$ are plasma-processed and modified.

For example, in the second processing block G2, a surface hydrophilizing apparatus 40 for hydrophilizing the surfaces $W_{U1}$ and $W_{L1}$ of the wafers $W_U$ and $W_L$ and cleaning the surfaces $W_{U1}$ and $W_{L1}$, for example, with pure water, and a bonding apparatus 41 for bonding the wafers $W_U$ and $W_L$ are arranged side by side in the named order from the side of the loading/unloading station 2 along the Y-direction which is the horizontal direction. A configuration of the bonding device 41 will be described later.

In the surface hydrophilizing apparatus 40, for example, pure water is supplied onto the wafers $W_U$ and $W_L$ while rotating the wafers $W_U$ and $W_L$ held by spin chucks. Then, the supplied pure water is diffused on the surfaces $W_{U1}$ and $W_{L1}$ of the wafers $W_U$ and $W_L$, whereby the surfaces $W_{U1}$ and $W_{L1}$ are hydrophilized.

For example, in the third processing block G3, as shown in FIG. 2, the transition devices 50 and 51 for the wafers $W_U$ and $W_L$ and the laminated wafer $W_T$ are provided in two stages sequentially from the bottom.

As shown in FIG. 1, a wafer transfer zone 60 is formed in a region surrounded by the first processing block G1 to the third processing block G3. In the wafer transfer zone 60, for example, a wafer transfer device 61 is arranged.

The wafer transfer device 61 includes a transfer arm that is movable, for example, in the vertical direction and the horizontal direction (the Y-direction and the X-direction) and rotatable about the vertical axis. The wafer transfer apparatus 61 moves within the wafer transfer zone 60 and can transfer the wafers $W_U$ and $W_L$ and the laminated wafer $W_T$ to predetermined apparatuses in the first processing block G1, the second processing block G2 and the third processing block G3.

In the above-described bonding system 1, a control part 70 is provided as shown in FIG. 1. The control part 70 is, for example, a computer, and includes a program storage part (not shown). In the program storage part, there is stored a program for controlling the process of the wafers $W_U$ and $W_L$ and the laminated wafer $W_T$ in the bonding system 1. The program storage part also stores a program for controlling the operations of driving systems of the above-described various processing apparatuses, the transfer devices and the like to realize a wafer bonding process (to be described later) in the bonding system 1. The programs described above are recorded on a computer-readable storage medium H such as a computer-readable hard disk (HD), a flexible disk (FD), a compact disk (CD), a magneto-optical disk (MO), a memory card or the like and may be installed in the control part 70 from the storage medium H.

2. Configuration of Bonding Apparatus

Next, the configuration of the above-described bonding apparatus 41 will be described.

2-1. Overall Configuration of Bonding Apparatus

Figure 4:
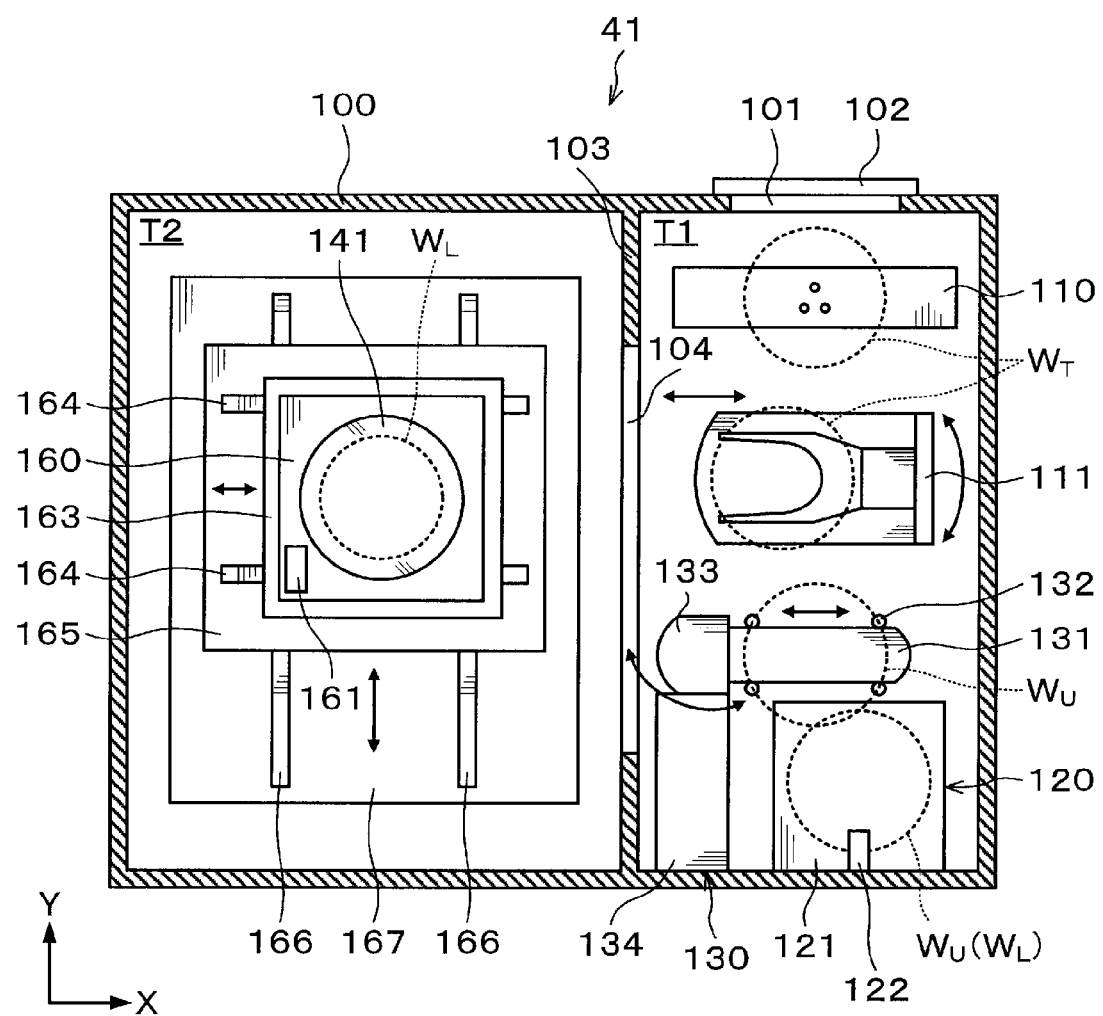
FIG. 4 is a horizontal sectional view schematically showing a configuration of a bonding apparatus.
Figure 5:
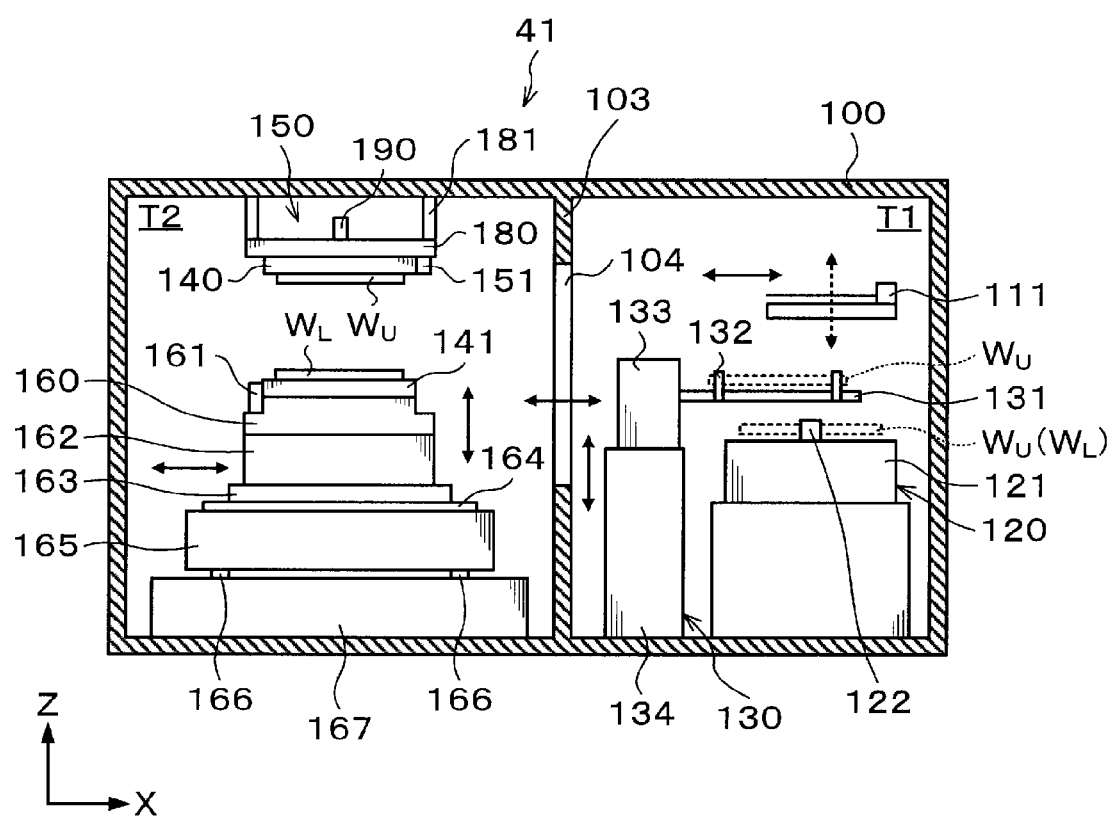
FIG. 5 is a vertical sectional view schematically showing a configuration of a bonding apparatus.

As shown in FIGS. 4 and 5, the bonding apparatus 41 includes a processing container 100, the interior of which is hermetically sealable. A loading/unloading port 101 through which the wafers $W_U$ and $W_L$ and the laminated wafer $W_T$ are transferred, is formed in the lateral surface of the processing container 100 at the side of the wafer transfer zone 60. An opening/closing shutter 102 is provided in the loading/unloading port 101.

The inside of the processing container 100 is partitioned into a transfer region T1 and a process region T2 by an inner wall 103. The loading/unloading port 101 described above is formed in the lateral surface of the processing container 100 in the transfer region T1. In addition, a loading/unloading port 104 through which the wafers $W_U$ and $W_L$ and the laminated wafer $W_T$ are transferred, is also formed in the inner wall 103.

A transition 110 for temporarily mounding the wafers $W_U$ and $W_L$ and the laminated wafer $W_T$ thereon is provided in the positive Y-direction of the transfer region T1. The transition 110 is formed in, for example, two stages and is capable of simultaneously mounting any two of the wafers $W_U$ and $W_L$ and the laminated wafer $W_T$ thereon.

In the transfer region T1, a wafer transfer mechanism 111 is provided. The wafer transfer mechanism 111 includes a transfer arm that is movable, for example, in the vertical direction and the horizontal direction (the X-direction and Y-direction) and rotatable about the vertical axis. The wafer transfer mechanism 111 can transfer the wafers $W_U$ and $W_L$ and the laminated wafer $W_T$ inside the transfer region T1 or between the transfer region T1 and the process region T2.

A position adjustment mechanism 120 for adjusting the horizontal orientation of the wafer $W_U$ or $W_L$ is provided in the negative Y-direction of the transfer region T1. The position adjustment mechanism 120 includes a base 121 provided with a holding part (not shown) for holding and rotating the wafer $W_U$ or $W_L$, and a detection part 122 for detecting the position of a notch portion of the wafer $W_U$ or $W_L$. The position adjusting mechanism 120 detects the position of the notch portion of the wafer $W_U$ or $W_L$ by the detection part 122 while rotating the wafer $W_U$ or $W_L$ held on the base 121, whereby the position of the notch portion is adjusted to adjust the horizontal orientation of the wafer $W_U$ or $W_L$. The structure for holding the wafer $W_U$ or $W_L$ on the base 121 is not particularly limited. Various structures such as, for example, a pin chuck structure and a spin chuck structure may be used.

In the transfer region T1, an inverting mechanism 130 for inverting the front and back surfaces of the upper wafer $W_U$ is provided. The inverting mechanism 130 includes a holding arm 131 for holding the upper wafer $W_U$. The holding arm 131 extends in the horizontal direction (the X-direction). In addition, in the holding arm 131, holding members 132 for holding the upper wafer $W_U$ are provided at, for example, four locations.

The holding arm 131 is supported by a driving part 133 including, for example, a motor or the like. The holding arm 131 is rotatable about a horizontal axis by the driving part 133. Furthermore, the holding arm 131 is rotatable about the driving part 133 and is movable in the horizontal direction (the X-direction). Below the driving part 133, another driving part (not shown) including, for example, a motor or the like is provided. This other driving part allows the driving part 133 to move in the vertical direction along a support column 134 extending in the vertical direction. In this way, the upper wafer $W_U$ held by the holding members 132 can be rotated about the horizontal axis and can be moved in the vertical direction and the horizontal direction by the driving part 133. In addition, the upper wafer $W_U$ held by the holding members 132 can rotate about the driving part 133 and can move between the position adjustment mechanism 120 and an upper chuck 140 described later.

In the process region T2, there are provided an upper chuck 140 as a first holding part for adsorptively holding the upper wafer $W_U$ on the lower surface thereof, and a lower chuck 141 as a second holding part for adsorptively holding the lower wafer $W_L$ mounted on the upper surface thereof. The lower chuck 141 is provided below the upper chuck 140 and is disposed to face the upper chuck 140. In other words, the upper wafer $W_U$ held by the upper chuck 140 and the lower wafer $W_L$ held by the lower chuck 141 can be arranged to face each other.

The upper chuck 140 is held by an upper chuck holding part 150 provided above the upper chuck 140. The upper chuck holding part 150 is provided on a ceiling surface of the processing container 100. In other words, the upper chuck 140 is fixed to the processing container 100 via the upper chuck holding part 150.

In the upper chuck holding part 150, there is provided an upper imaging part 151 configured to image the surface $W_{L1}$ of the lower wafer $W_L$ held by the lower chuck 141. In other words, the upper imaging part 151 is provided adjacent to the upper chuck 140. For example, a CCD camera is used as the upper imaging part 151.

The lower chuck 141 is supported by a lower chuck stage 160 provided below the lower chuck 141. In the lower chuck stage 160, there is provided a lower imaging part 161 configured to image the surface $W_{U1}$ of the upper wafer $W_U$ held by the upper chuck 140. In other words, the lower imaging part 161 is provided adjacent to the lower chuck 141. For example, a CCD camera is used as the lower imaging part 161.

The lower chuck stage 160 is supported by a first lower chuck moving part 162 provided below the lower chuck stage 160. The first lower chuck moving part 162 is supported by a support base 163. The first lower chuck moving part 162 is configured to move the lower chuck 141 in the horizontal direction (the X-direction) as described later. Furthermore, the first lower chuck moving part 162 is configured to move the lower chuck 141 in the vertical direction and to rotate the lower chuck 141 about the vertical axis.

The support base 163 is attached to a pair of rails 164 and 164 provided at the lower surface side of the support base 163 and extending in the horizontal direction (the X-direction). The support base 163 is configured to move along the pair of rails 164 by the first lower chuck moving part 162. The first lower chuck moving part 162 is moved by, for example, a linear motor (not shown) provided along the rails 164.

The rails 164 and 164 are disposed in a second lower chuck moving part 165. The second lower chuck moving part 165 is attached to a pair of rails 166 and 166 provided at the lower surface side of the second lower chuck moving part 165 and extending in the horizontal direction (the Y-direction). The second lower chuck moving part 165 is configured to move along the rails 166. That is to say, the second lower chuck moving part 165 is configured to move the lower chuck 141 in the horizontal direction (the Y-direction). The second lower chuck moving part 165 is moved by, for example, a linear motor (not shown) provided along the rails 166. The rails 166 and 166 are disposed on a mounting table 167 provided on the bottom surface of the processing container 100.

2-2. Configuration of Upper Chuck

Next, a detailed configuration of the upper chuck 140 of the bonding apparatus 41 will be described.

Figure 6:
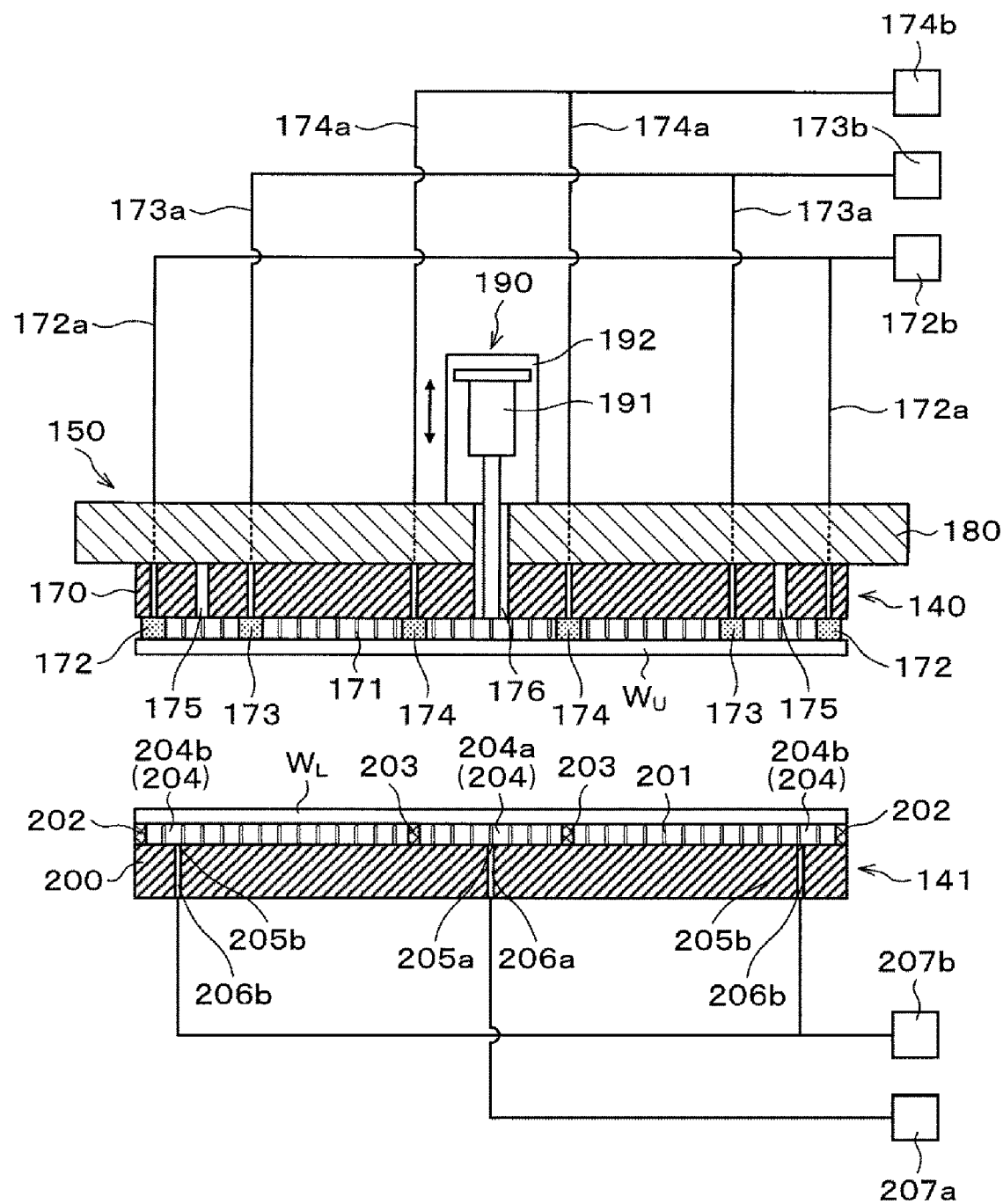
FIG. 6 is a vertical sectional view schematically showing configurations of an upper chuck, an upper chuck holding part and a lower chuck.
Figure 7:
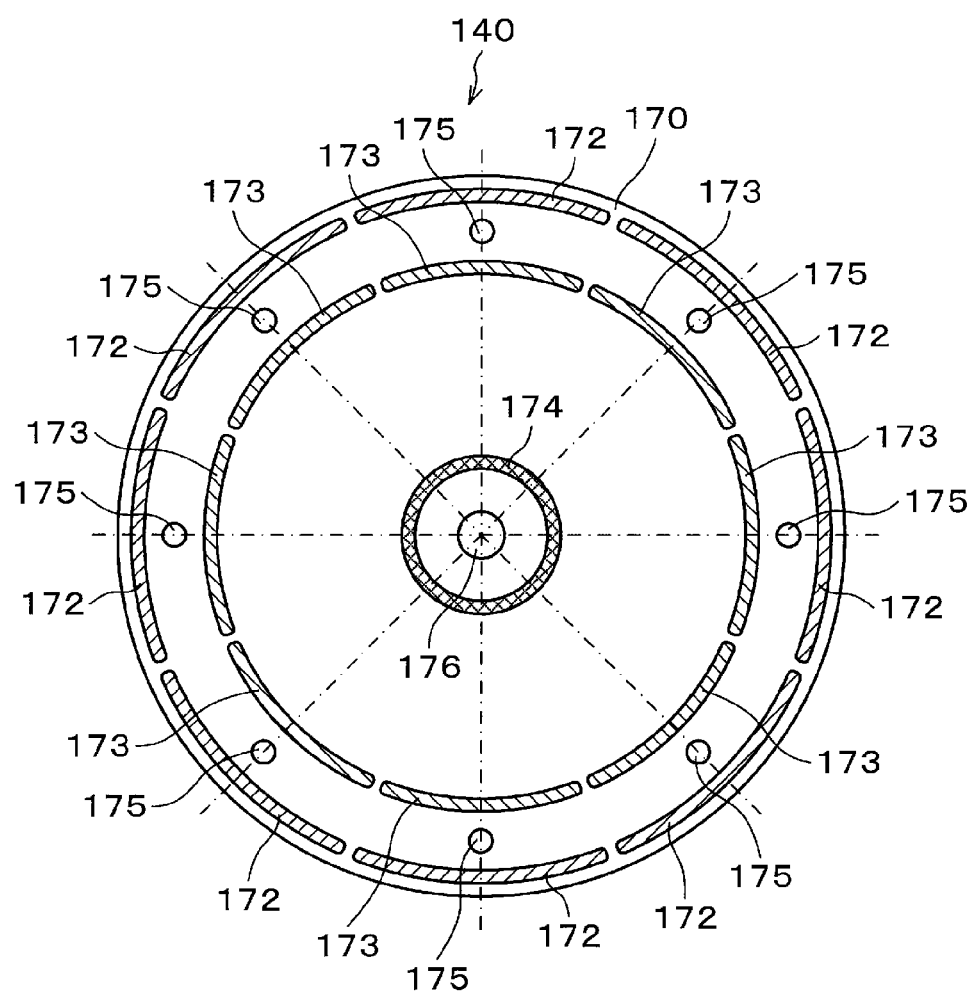
FIG. 7 is a plan view of an upper chuck as viewed from below.

As shown in FIGS. 6 and 7, a pin chuck system is used as the upper chuck 140. The upper chuck 140 includes a main body part 170 having a diameter equal to or larger than a diameter of the upper wafer $W_U$ in a plan view. A plurality of pins 171 for making contact with the back surface $W_{U2}$ of the upper wafer $W_U$ is provided on the lower surface of the main body part 170. In FIG. 7, the illustration of the pins 171 is omitted.

A plurality of suction portions 172 to 174 for vacuum-drawing and adsorbing the upper wafer $W_U$ is provided on the lower surface of the main body part 170. The suction portions 172 to 174 have the same height as the pins 171 and make contact with the back surface $W_{U2}$ of the upper wafer $W_U$.

The first suction portions 172 have an arc shape in a plan view. A plurality of, for example, eight, first suction portions 172 are arranged side by side in an outer peripheral portion of the main body part 170 in a concentric relationship with the main body part 170 at predetermined intervals in the circumferential direction.

A first vacuum pump 172b is connected to each of the eight first suction portions 172 via first suction pipes 172a, respectively. By the vacuum-drawing performed by the first vacuum pump 172b, the eight first suction portions 172 can individually suck the upper wafer $W_U$.

Similar to the first suction portions 172, the second suction portions 173 have an arc shape in a plan view. A plurality of, for example, eight, second suction portions 173 are arranged side by side at the inner peripheral side of the main body part 170 inward of the first suction portions 172 in a concentric relationship with the main body part 170 at predetermined intervals in the circumferential direction. Central portions of the first suction portions 172 and central portions of the second suction portions 173 are disposed on the central line of the main body part 170.

A second vacuum pump 173b is connected to each of the eight second suction portions 173 via second suction pipes 173a, respectively. By vacuum-drawing performed by the second vacuum pump 173b, the eight second suction portions 173 can individually suck the upper wafer $W_U$.

The third suction portion 174 has an annular shape in a plan view. The third suction portion 174 is disposed at the inner peripheral side of the main body part 170 inward of the second suction portions 173 in a concentric relationship with the main body part 170. A third vacuum pump 174b is connected to the third suction portion 174 via third suction pipes 174a. By the vacuum-drawing performed by the third vacuum pump 174b, the third suction portion 174 can suck the upper wafer $W_U$.

In the main body part 170, there are provided sensors 175 as substrate detection parts for detecting the detachment of the upper wafer $W_U$ from the main body part 170. A plurality of, for example, eight, sensors 175 are arranged side by side between the first suction portions 172 and the second suction portions 173 in a concentric relationship with the main body part 170 at predetermined intervals in the circumferential direction. That is to say, central portions of the sensors 175, the central portions of the first suction portions 172 and the central portions of the second suction portions 173 are disposed on the central line of the main body part 170. Details of the type and arrangement of the sensors 175 will be described later.

A through-hole 176 penetrating the main body part 170 in the thickness direction is formed in the central portion of the main body part 170. The central portion of the main body part 170 corresponds to the central portion of the upper wafer $W_U$ adsorptively held by the upper chuck 140. A leading end portion of an actuator part 191 of a pressing member 190, which will be described later, is inserted through the through-hole 176.

2-3. Details of Sensor of Upper Chuck

Next, the details of the above-described sensors 175 and a control method of the suction portions 172 to 174 using the inspection results of the sensors 175 will be described.

When bonding the upper wafer $W_U$ and the lower wafer $W_L$ as will be described later, first, the central portion of the upper wafer $W_U$ is pushed down and brought into contact with the central portion of the lower wafer $W_L$. The central portion of the upper wafer $W_U$ and the central portion of the lower wafer $W_L$ are bonded by virtue of an intermolecular force, whereby a bonding area is formed in the central portions of both wafers. Thereafter, a bonding wave is generated such that the bonding area expands from the central portions of both wafers $W_U$ and $W_L$ toward the outer peripheral portions thereof. Thus, the front surfaces $W_{U1}$ and $W_{L1}$ of the upper wafer $W_U$ and the lower wafer $W_L$ are bonded to each other over the entire surfaces.

The sensors 175 are provided in the main body part 170 in order to grasp the bonding wave.

Various sensors may be used as the sensors 175. For example, reflection type fiber sensors may be used as the sensors 175. In such a case, light is emitted from the sensors 175 toward the upper wafer $W_U$, and the reflected light is received by the sensors 175 to measure a received light amount. By measuring the reception amount of the reflected light, it is possible to grasp the degree of orthogonality between the optical axis and the upper wafer $W_U$. That is to say, when the amount of reflected light is small, the degree of orthogonality between the optical axis and the upper wafer $W_U$ is large (the inclination of the upper wafer $W_U$ is large). This means that the upper wafer $W_U$ is detached from the upper chuck 140 and is not in contact with the lower wafer $W_L$. On the other hand, when the amount of reflected light is large, the degree of orthogonality between the optical axis and the upper wafer $W_U$ is small (the inclination of the upper wafer $W_U$ is small). This means that the upper wafer $W_U$ is detached from the upper chuck 140 and is in contact with the lower wafer $W_L$. Therefore, by measuring the reflected light amount with the sensors 175, it is possible to detect the contact state of the upper wafer $W_U$ and the lower wafer $W_L$ in the sensors 175 (in other words, the state of the detachment of the upper wafer $W_U$ from the upper chuck 140). This makes it possible to grasp the bonding wave.

For example, electrostatic capacitance sensors or distance measurement sensors may be used as the sensors 175. In the case of using the electrostatic capacitance sensors, the distance between the upper chuck 140 and the upper wafer $W_U$ can be measured by measuring the electrostatic capacitance with the upper wafer $W_U$. In the case of using the distance measurement sensors, the distance between the upper chuck 140 and the upper wafer $W_U$ can be measured by emitting a laser beam from the sensors 175 toward the upper wafer $W_U$ and receiving the reflected light by the sensors 175. By measuring the distance between the upper chuck 140 and the upper wafer $W_U$ in this manner, it is possible to detect the contact state between the upper wafer $W_U$ and the lower wafer $W_L$ in the sensors 175 (in other words, the state of the detachment of the upper wafer $W_U$ from the upper chuck 140). This makes it possible to grasp the bonding wave.

For example, fluid sensors may be used as the sensors 175. In this case, adsorbing pads (not shown) are provided in the main body part 170. That is to say, the adsorbing pads may be provided at the positions of reference numeral "175" shown in FIGS. 6 and 7, and the sensors 175 may be provided in suction pipes (not shown) connected to the respective adsorbing pads. The adsorbing pads are not intended to adsorptively hold the upper wafer $W_U$, but are configured to vacuum-draw the upper wafer $W_U$ with a very low pressure, for example, about −10 kPa, that does not affect the bonding wave. The sensors 175 measure a flow rate or pressure of a gas flowing through the respective suction pipes. For example, when the upper wafer $W_U$ is detached from the upper chuck 140, the flow of the gas inside the suction pipes is changed, and the flow rate and pressure of the gas is changed. The sensors 175 can measure the change in gas flow inside the suction pipes and can detect the detachment of the upper wafer $W_U$ from the upper chuck 140 (in other words, the contact state between the upper wafer $W_U$ and the lower wafer $W_L$). This makes it possible to grasp the bonding wave. The sensor 175 may be provided in the first suction pipes 172a of the first suction portions 172 and the second suction pipes 173a of the second suction portions 173, respectively.

As described above, the sensors 175 are disposed side by side between the first suction portions 172 and the second suction portions 173 in a concentric relationship with the main body part 170 at predetermined intervals in the circumferential direction. Next, the arrangement of the sensors 175 will be described.

Figure 8:
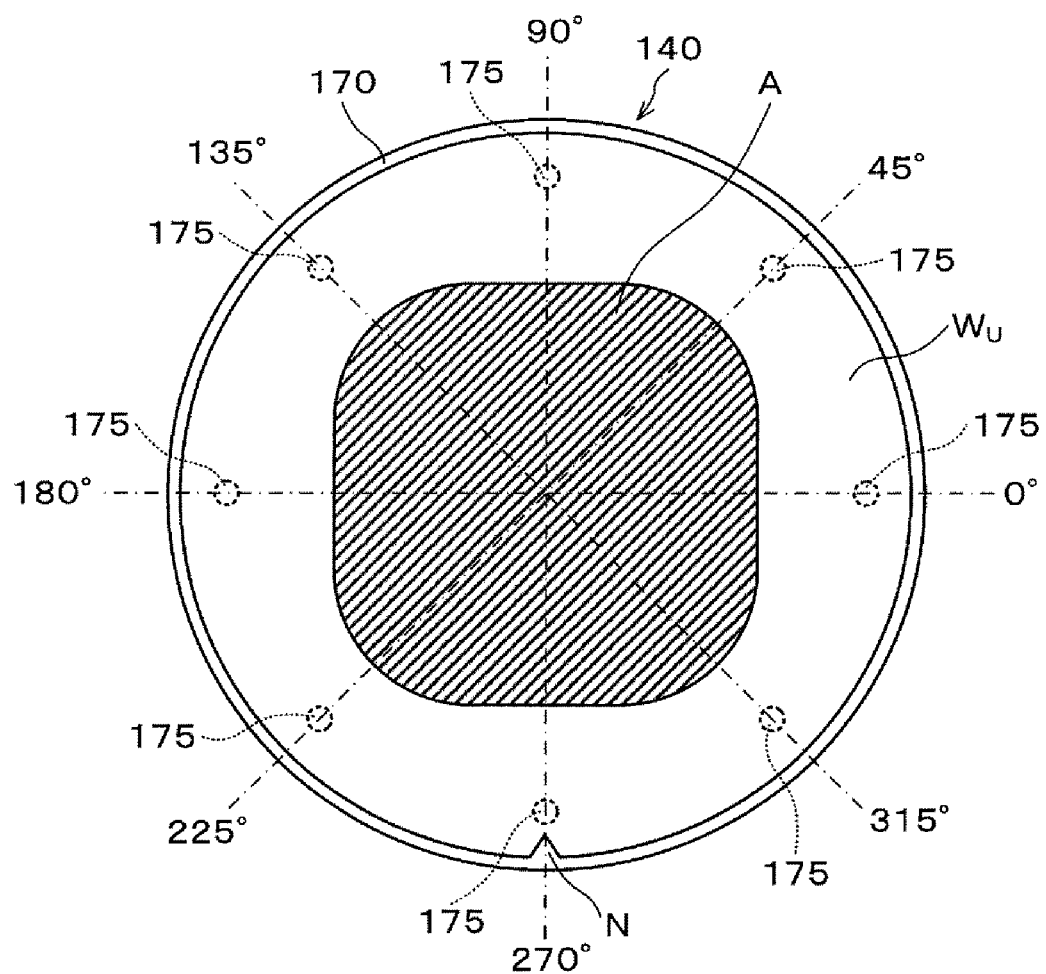
FIG. 8 is an explanatory view showing a state of expansion of a bonding area between wafers in the related art.

The arrangement of the sensors 175 is determined according to the physical properties of the upper wafer $W_U$, for example, the anisotropy such as Young's modulus and Poisson's ratio. FIG. 8 is an explanatory view showing a state of expansion of a bonding area between wafers in the related art. The present inventors have found that as shown in FIG. 8, the bonding area A is not concentrically expanded but is non-uniformly expanded when performing a bonding process. FIG. 8 is a plan view of the upper wafer $W_U$ held by the upper chuck 140 as viewed from below.

The upper wafer $W_U$ is a monocrystalline silicon wafer having a crystal direction of [100] in a direction perpendicular to the front surface $W_{U1}$. The notch portion N of the upper wafer $W_U$ is formed in the outer edge of the upper wafer $W_U$ in a [011] crystal direction. The bonding area A is more rapidly expanded in directions of a 45° period (directions of 45°, 135°, 225° and 315° shown in FIG. 8) (hereinafter sometimes referred to as "45° directions") with reference to a direction oriented in a [010] crystal direction parallel to the front surface $W_{U1}$ of the upper wafer $W_U$, from the central portion of the upper wafer $W_U$, rather than in directions of a 90° period (directions of 0°, 90°, 180° and 270° shown in FIG. 8) (hereinafter sometimes referred to as "90° directions") with reference to a direction oriented in a [0-11] crystal direction parallel to the front surface $W_{U1}$ of the upper wafer $W_U$, from the central portion of the upper wafer $W_U$. As a result, the shape of the bonding area A, which was circular at the start of bonding (central portion bonding), is getting close to a quadrangle having vertices located in the 45° directions as the bonding area A is expanded.

In the present embodiment, the eight sensors 175 are provided in a concentric relationship with the main body part 170. That is to say, the sensors 175 are provided in the 90° directions and the 45° directions. Therefore, by detecting the detachment of the upper wafer $W_U$ from the upper chuck 140 with the sensors 175 and detecting the bonding area A shown in FIG. 8, it is possible to grasp the bonding wave.

The detection results of the sensors 175 are outputted to the control part 70. The control part 70 controls the operations of the suction portions 172 to 174 based on the detection results of the sensors 175.

Figure 9A:
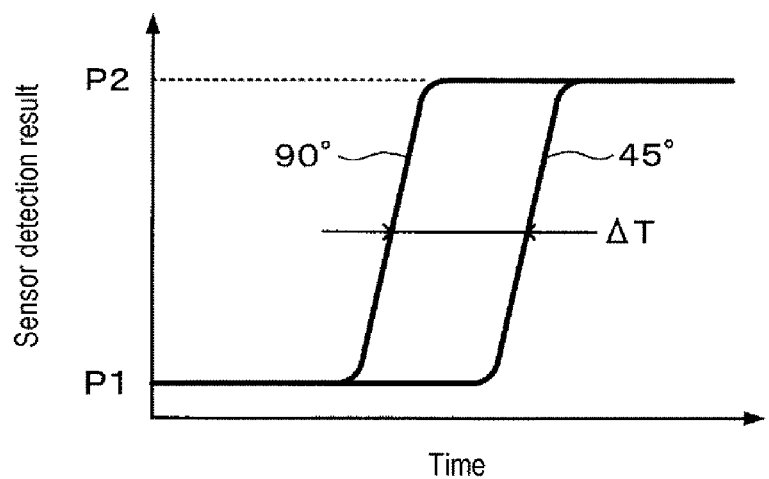
FIGS. 9A and 9B are graphs showing examples of a detection result of sensors.
Figure 9B:
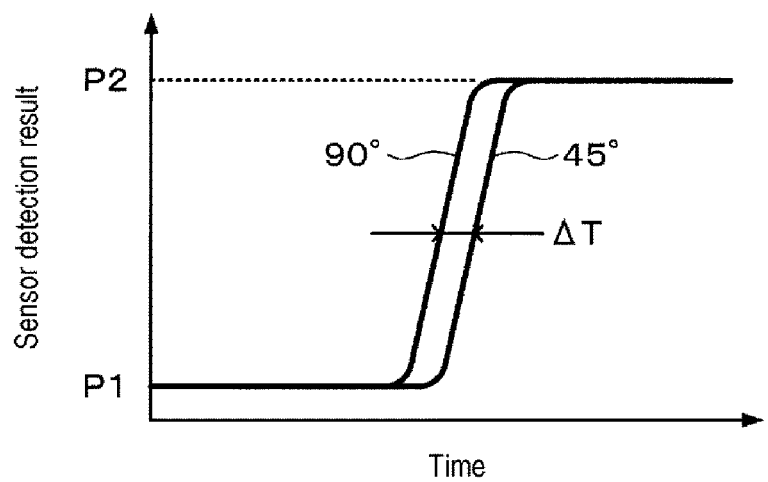

FIGS. 9A and 9B are graphs showing examples of the detection result of the sensors 175. The horizontal axis in FIGS. 9A and 9B represents the elapsed time of the bonding process, and the vertical axis represents the output result of the sensors 175, namely the position of the upper wafer $W_U$ relative to the upper chuck 140. When the detection result of the sensors 175 is P1 (when the upper wafer $W_U$ is close to the upper chuck 140), the upper wafer $W_U$ is in contact with the upper chuck 140 at the positions of the sensors 175, and the bonding area A is not reached. When the detection result of the sensors 175 is P2 (when the upper wafer $W_U$ is far from the upper chuck 140), the upper wafer $W_U$ is separated from the upper chuck 140 at the positions of the sensors 175 and is in contact with the lower wafer $W_L$. Thus, the bonding area A is reached.

FIG. 9A shows a case where the bonding area A is uneven and is expanded in a substantially quadrangular shape as shown in FIG. 8. As described above, the bonding area A is expanded faster in the 45° directions than in the 90° directions. Therefore, a time difference ΔT between the timing when the bonding area A is reached in the 45° directions and the timing when the bonding area A is reached in the 90° directions increases.

Therefore, in order to make the expansion of the bonding area A uniform, the control part 70 performs control so that the time difference ΔT falls within a predetermined threshold value as shown in FIG. 9B. There is a correlation between the time difference ΔT and the distortion of the laminated wafer $W_T$ after bonding. The predetermined threshold value of ΔT is set from the allowable range of distortion of the laminated wafer $W_T$.

Specifically, the control of the control part 70 includes delaying the timing at which the second suction portions 173 release the upper wafer $W_U$ in the 45° directions, and advancing the timing at which the second suction portions 173 release the upper wafer $W_U$ in the 90° directions. Thus, at the positions of the eight sensors 175, the timings at which the bonding area A is reached can be made substantially the same. Therefore, it is possible to make the expansion of the bonding area A uniform and to make the bonding wave (nearly concentric shape) uniform.

In the present embodiment, the case where the suction timing of the second suction portions 173 is controlled based on the detection result of the sensors 175 has been described. However, the suction force of the second suction portions 173 may be further controlled. In addition, other suction portions 172 and 174 may be controlled based on the detection result of the sensors 175.

2-4. Configuration of Upper Chuck Holding Part

Next, a detailed configuration of the upper chuck holding part 150 of the bonding apparatus 41 will be described.

As shown in FIG. 5, the upper chuck holding part 150 includes an upper chuck stage 180 provided on the upper surface of the main body part 170 of the upper chuck 140. The upper chuck stage 180 is provided so as to cover at least the upper surface of the main body part 170 in a plan view and is fixed to the main body part 170 by, for example, screws. The upper chuck stage 180 is supported by a plurality of support members 181 provided on the ceiling surface of the processing container 100.

On the upper surface of the upper chuck stage 180, as shown in FIG. 6, the pressing member 190 for pressing the central portion of the upper wafer $W_U$ is further provided. The pressing member 190 includes the actuator part 191 and a cylinder part 192.

The actuator part 191 generates a constant pressure in a certain direction using the air supplied from an electropneumatic regulator (not shown). Thus, the pressure can be generated constantly regardless of a position to which the pressure is applied. By the air supplied from the electropneumatic regulator, the actuator part 191 can make contact with the central portion of the upper wafer $W_U$ and can control a press load to be applied to the central portion of the upper wafer $W_U$. In addition, the leading end portion of the actuator part 191 can be moved up and down in the vertical direction through the through-hole 176 by the air supplied from the electro-pneumatic regulator.

The actuator part 191 is supported by the cylinder part 192. The cylinder part 192 can move the actuator part 191 in the vertical direction using, for example, a driving part that incorporates a motor.

As described above, the pressing member 190 controls the press load using the actuator part 191 and controls the movement of the actuator part 191 using the cylinder part 192. At the time of bonding the wafers $W_U$ and $W_L$ to be described later, the pressing member 190 can bring the central portion of the upper wafer $W_U$ and the central portion of the lower wafer $W_L$ into contact with each other and can press them against each other.

2-5. Configuration of Lower Chuck

Next, a detailed configuration of the lower chuck 141 of the bonding apparatus 41 will be described.

As shown in FIG. 6, the lower chuck 141 adopts a pin chuck system just like the upper chuck 140. The lower chuck 141 includes a main body part 200 having a diameter equal to or larger than a diameter of the lower wafer $W_L$ in a plan view. On the upper surface of the main body part 200, there is provided a plurality of pins 201 that makes contact with the back surface $W_{L2}$ of the lower wafer $W_L$. An outer rib 202 having the same height as the pins 201 and supporting an outer peripheral portion of the back surface $W_{L2}$ of the lower wafer $W_L$ is provided on an outer peripheral portion of the upper surface of the main body part 200. The outer rib 202 is annularly provided outside the plurality of pins 201.

On the upper surface of the main body part 200, an inner rib 203 having the same height as the pins 201 and supporting the back surface $W_{L2}$ of the lower wafer $W_L$ is provided inward of the outer rib 202. The inner rib 203 is annularly provided in a concentric relationship with the outer rib 202. An inner region 204 of the outer rib 202 (hereinafter sometimes referred to as "suction region 204") is partitioned into a first suction region 204a defined inward of the inner rib 203 and a second suction region 204b defined outward of the inner rib 203.

In the upper surface of the main body part 200, a first suction port 205a for vacuum-drawing the lower wafer $W_L$ is formed in the first suction region 204a. The first suction port 205a is formed, for example, at one location in the first suction region 204a. A first suction pipe 206a provided inside the main body part 200 is connected to the first suction port 205a. A first vacuum pump 207a is connected to the first suction pipe 206a.

In the upper surface of the main body part 200, second suction ports 205b for vacuum-drawing the lower wafer $W_L$ are formed in the second suction region 204b. The second suction ports 205b are formed, for example, at two locations in the second suction region 204b. Second suction pipes 206b provided inside the main body part 200 are connected to the second suction ports 205b. A second vacuum pump 207b is connected to the second suction pipes 206b.

The suction regions 204a and 204b surrounded by the lower wafer $W_L$, the main body part 200 and the outer rib 202 are vacuum-drawn from the suction ports 205a and 205b, respectively, whereby pressures of the suction regions 204a and 204b are reduced. At this time, the atmosphere outside the suction regions 204a and 204b is kept at atmospheric pressure. Therefore, the lower wafer $W_L$ is pushed toward the suction regions 204a and 204b by the atmospheric pressure just as much as the reduced pressures. Thus, the lower wafer $W_L$ is adsorptively held by the lower chuck 141. In addition, the lower chuck 141 is configured to be able to vacuum-draw the lower wafer $W_L$ for each of the first suction region 204a and the second suction region 204b.

In the lower chuck 141, through-holes (not shown) penetrating the main body part 200 in the thickness direction are formed, for example, at three locations, near the central portion of the main body part 200. Lift pins provided under the first lower chuck moving part 162 are inserted through the through-holes.

In the outer peripheral portion of the main body part 200, there are provided guide members (not shown) that prevent the wafers $W_U$ and $W_L$ and the laminated wafer $W_T$ from jumping out or sliding down from the lower chuck 141. The guide members are provided at a plurality of (for example, four) locations, in the outer peripheral portion of the main body part 200 at equal intervals.

The operations of the respective parts in the bonding apparatus 41 are controlled by the control part 70 described above.

3. Bonding Method

Figure 10:
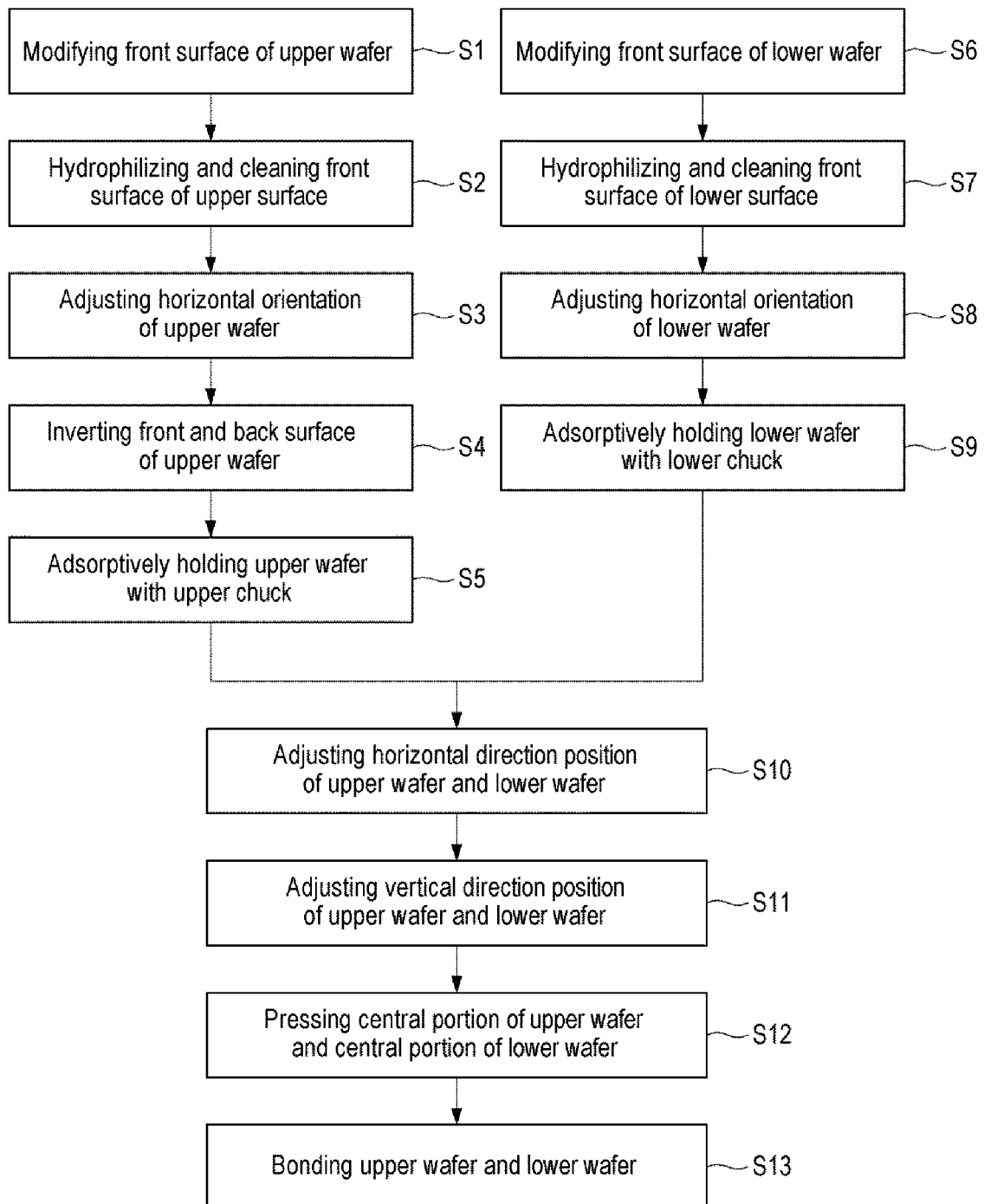
FIG. 10 is a flowchart showing main steps of a wafer bonding process.

Next, a bonding method of the wafers $W_U$ and $W_L$ performed using the bonding system 1 configured as above will be described. FIG. 10 is a flowchart showing an example of main steps of a wafer bonding process.

First, a cassette $C_U$ accommodating a plurality of upper wafers $W_U$, a cassette $C_L$ accommodating a plurality of lower wafers $W_L$ and an empty cassette $C_T$ are mounted on predetermined cassette mounting plates 11 of the loading/unloading station 2. Thereafter, the upper wafer $W_U$ accommodated in the cassette $C_U$ is taken out by the wafer transfer device 22 and is transferred to the transition device 50 of the third processing block G3 of the processing station 3.

Subsequently, the upper wafer $W_U$ is transferred to the surface modifying apparatus 30 of the first processing block G1 by the wafer transfer device 61. In the surface modifying apparatus 30, an oxygen gas or a nitrogen gas, which is a processing gas, is excited, plasma-plasmarized and ionized under a predetermined reduced-pressure atmosphere. The oxygen ion or the nitrogen ion is irradiated onto the front surface $W_{U1}$ of the upper wafer $W_U$, whereby the front surface $W_{U1}$ is plasma-processed. Thus, the front surface $W_{U1}$ of the upper wafer $W_U$ is modified (step S1 in FIG. 10).

Subsequently, the upper wafer $W_U$ is transferred to the surface hydrophilizing apparatus 40 of the second processing block G2 by the wafer transfer device 61. In the surface hydrophilizing apparatus 40, pure water is supplied onto the upper wafer $W_U$ while rotating the upper wafer $W_U$ held by the spin chuck. Then, the supplied pure water is diffused on the front surface $W_{U1}$ of the upper wafer $W_U$. Thus, hydroxyl groups (silanol groups) adhere to the front surface $W_{U1}$ of the upper wafer $W_U$ modified in the surface modifying apparatus 30, whereby the front surface $W_{U1}$ is hydrophilized. In addition, the front surface $W_{U1}$ of the upper wafer $W_U$ is cleaned by the pure water (step S2 in FIG. 10).

Subsequently, the upper wafer $W_U$ is transferred to the bonding apparatus 41 of the second processing block G2 by the wafer transfer device 61. The upper wafer $W_U$ loaded into the bonding apparatus 41 is transferred to the position adjustment mechanism 120 by the wafer transfer mechanism 111 via the transition 110. Then, the horizontal orientation of the upper wafer $W_U$ is adjusted by the position adjustment mechanism 120 (step S3 in FIG. 10).

Thereafter, the upper wafer $W_U$ is delivered from the position adjustment mechanism 120 to the holding arm 131 of the inverting mechanism 130. Subsequently, in the transfer region T1, the holding arm 131 is inverted so that the front and back surfaces of the upper wafer $W_U$ are inverted (step S4 in FIG. 10). That is to say, the front surface $W_{U1}$ of the upper wafer $W_U$ is oriented downward.

Thereafter, the holding arm 131 of the inverting mechanism 130 rotates about the driving part 133 and moves below the upper chuck 140. Then, the upper wafer $W_U$ is delivered from the inverting mechanism 130 to the upper chuck 140. The back surface $W_{U2}$ of the upper wafer $W_U$ is adsorptively held by the upper chuck 140 (step S5 in FIG. 10). Specifically, the vacuum pumps 172b, 173b and 174b are operated to vacuum-draw the upper wafer $W_U$ with the suction portions 172, 173 and 174, whereby the upper wafer $W_U$ is adsorptively held by the upper chuck 140.

While the processes of the above steps S1 to S5 are performed on the upper wafer $W_U$, the process for the lower wafer $W_L$ is performed following the upper wafer $W_U$. First, the lower wafer $W_L$ accommodated in the cassette $C_L$ is taken out by the wafer transfer device 22 and is transferred to the transition device 50 of the processing station 3.

Subsequently, by the wafer transfer apparatus 61, the lower wafer $W_L$ is transferred to the surface modifying apparatus 30 where the front surface $W_{L1}$ of the lower wafer $W_L$ is modified (step S6 in FIG. 10). In step S6, the front surface $W_{L1}$ of the lower wafer $W_L$ is modified in the same manner as in the above-described step S1.

Thereafter, by the wafer transfer device 61, the lower wafer $W_L$ is transferred to the surface hydrophilizing apparatus 40 where the front surface $W_{L1}$ of the lower wafer $W_L$ is hydrophilized and cleaned (step S7 in FIG. 10). In step S7, the front surface $WL_1$ of the lower wafer WL is hydrophilized and cleaned in the same manner as in the above-described step S2.

Thereafter, the lower wafer $W_L$ is transferred to the bonding apparatus 41 by the wafer transfer device 61. The lower wafer $W_L$ loaded into the bonding apparatus 41 is transferred to the position adjustment mechanism 120 by the wafer transfer mechanism via the transition 110. Then, the horizontal orientation of the lower wafer $W_L$ is adjusted by the position adjustment mechanism 120 (step S8 in FIG. 10).

Thereafter, the lower wafer $W_L$ is transferred to the lower chuck 141 by the wafer transfer mechanism 111, and the back surface $W_{L2}$ of the lower wafer $W_L$ is adsorptively held by the lower chuck 141 (step S9 in FIG. 10). Specifically, the vacuum pumps 207a and 207b are operated to vacuum-draw the lower wafer $W_L$ via the suction ports 205a and 205b in the suction regions 204a and 204b, whereby the lower wafer $W_L$ is adsorptively held by the lower chuck 141.

Subsequently, the horizontal positions of the upper wafer $W_U$ held by the upper chuck 140 and the lower wafer $W_L$ held by the lower chuck 141 are adjusted. Specifically, the lower chuck 141 is moved in the horizontal direction (the X-direction and the Y-direction) by the first lower chuck moving part 162 and the second lower chuck moving part 165, and predetermined reference points on the front surface $W_{L1}$ of the lower wafer $W_L$ are sequentially imaged using the upper imaging part 151. At the same time, predetermined reference points on the front surface $W_{U1}$ of the upper wafer $W_U$ are sequentially imaged using the lower imaging part 161. The images thus captured are outputted to the control part 70. Based on the image captured by the upper imaging part 151 and the image captured by the lower imaging part 161, the control part 70 controls the first lower chuck moving part 162 and the second lower chuck moving part 165 to move the lower chuck 141 to a position where the reference points of the upper wafer $W_U$ and the reference points of the lower wafer $W_L$ are respectively aligned with one another. In this way, the horizontal positions of the upper wafer $W_U$ and the lower wafer $W_L$ are adjusted (step S10 in FIG. 10).

In step S10, as described above, the lower chuck 141 is moved in the horizontal direction, and is also rotated by the first lower chuck moving part 162, whereby the rotational direction position of the lower chuck 141 (the orientation of the lower chuck 141) is also adjusted.

Figure 11:
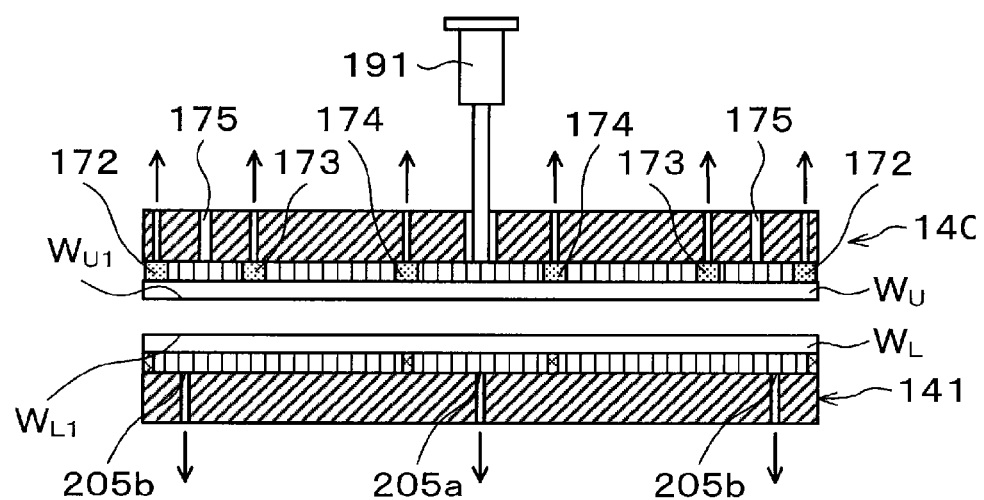
FIG. 11 is an explanatory view showing a state in which an upper wafer and a lower wafer are arranged to face each other.

Thereafter, the lower chuck 141 is vertically moved upward by the first lower chuck moving part 162, and the vertical positions of the upper chuck 140 and the lower chuck 141 are adjusted to adjust the vertical positions of the upper wafer $W_U$ held by the upper chuck 140 and the lower wafer $W_L$ held by the lower chuck 141 (step S11 in FIG. 10). The distance between the front surface $W_{L1}$ of the lower wafer $W_L$ and the front surface $W_{U1}$ of the upper wafer $W_U$ is adjusted to a predetermined distance, for example, 50 to 200 μm. Thus, as shown in FIG. 11, the upper wafer $W_U$ and the lower wafer $W_L$ are aligned to face each other at predetermined positions.

Subsequently, the bonding process of the upper wafer $W_U$ held by the upper chuck 140 and the lower wafer $W_L$ held by the lower chuck 141 is performed.

In the present embodiment, descriptions will be made on a case where the suction timing of the second suction parts 173 is set in advance so that the bonding wave becomes uniform as described above. That is to say, for example, the expansion of the bonding area A is detected by the sensors 175 with respect to the upper wafers $W_U$ of the previous lot. Based on the detection result, the suction timing of the second suction parts 173 with respect to the upper wafer $W_U$ of the current lot is set.

Figure 12:
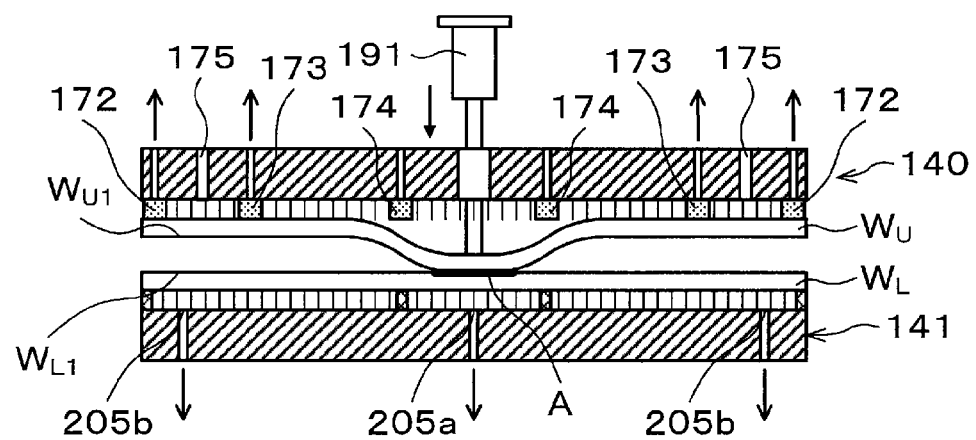
FIG. 12 is an explanatory view showing a state in which a central portion of an upper wafer and a central portion of a lower wafer are pressed and brought into contact with each other.

First, as shown in FIG. 12, the actuator part 191 is lowered by the cylinder part 192 of the pressing member 190. Then, as the actuator part 191 is lowered, the central portion of the upper wafer $W_U$ is pressed and lowered. At this time, a predetermined press load is applied to the actuator part 191 by the air supplied from the electro-pneumatic regulator. Then, the central portion of the upper wafer $W_U$ and the central portion of the lower wafer $W_L$ are brought into contact with each other and pressed against each other by the pressing member 190 (step S12 in FIG. 10).

In step S13, the operation of the first vacuum pump 172b is stopped to stop the vacuum-drawing of the upper wafer $W_U$ from the first suction portions 172. While operating the second vacuum pump 173b and the third vacuum pump 174b, the upper wafer $W_U$ is vacuum-drawn by the second suction portions 173 and the third suction portion 174.

If the central portion of the upper wafer $W_U$ and the central portion of the lower wafer $W_L$ are brought into contact with each other and pressed against each other, bonding is started between the central portions. That is to say, since the front surface $W_{U1}$ of the upper wafer $W_U$ and the front surface $W_{L1}$ of the lower wafer $W_L$ have been modified in steps S1 and S6, respectively, a van der Waals force (intermolecular force) is first generated between the front surfaces $W_{U1}$ and $W_{L1}$, whereby the front surfaces $W_{U1}$ and $W_{L1}$ are bonded to each other. Furthermore, since the front surface $W_{U1}$ of the upper wafer $W_U$ and the front surface $W_{L1}$ of the lower wafer $W_L$ have been hydrophilized in steps S2 and S7, respectively, the hydrophilic groups existing between the front surfaces $W_{U1}$ and $W_{L1}$ are hydrogen-bonded (which generates an intermolecular force). Thus, the front surfaces $W_{U1}$ and $W_{L1}$ are strongly bonded to each other. In this way, the bonding area A is formed.

Thereafter, between the upper wafer $W_U$ and the lower wafer $W_L$, a bonding wave is generated in which the bonding area A expands from the center portions of the upper wafer $W_U$ and the lower wafer $W_L$ toward the outer peripheral portions thereof.

Figure 13:
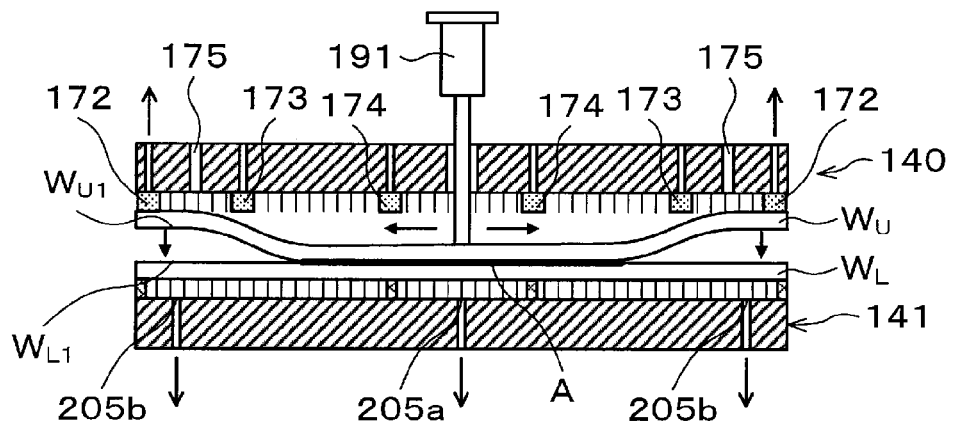
FIG. 13 is an explanatory view showing a state in which the bonding of an upper wafer and a lower wafer is expanded from a central portion to an outer peripheral portion.

The operation of the second vacuum pump 173b is stopped in a state in which the central portion of the upper wafer $W_U$ and the central portion of the lower wafer $W_L$ are pressed against each other by the pressing member 190 as shown in FIG. 13. Thus, the vacuum-drawing of the upper wafer $W_U$ from the second suction portions 173 is stopped. At this time, as described above, the suction timings of the eight second suction portions 173 are made different. That is to say, the timing at which the second suction portions 173 release the upper wafer $W_U$ in the 45° directions is delayed, and the timing at which the second suction portions 173 release the upper wafer $W_U$ in the 90° directions is advanced. As a result, at the positions of the eight sensors 175, the timings at which the bonding area A is reached can be made substantially the same. This makes the bonding wave uniform.

Figure 14:
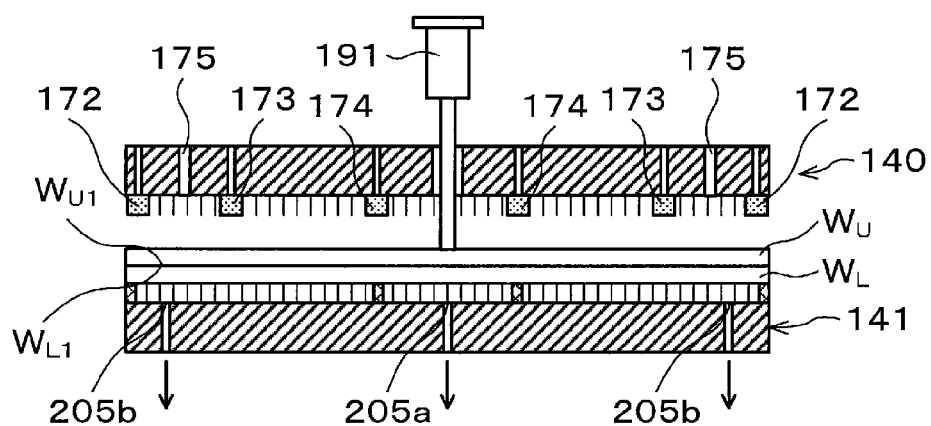
FIG. 14 is an explanatory view showing a state in which a surface of an upper wafer and a surface of a lower wafer are brought into contact with each other.

As shown in FIG. 14, the operation of the third vacuum pump 174b is stopped, and the vacuum-drawing of the upper wafer $W_U$ from the third suction portion 174 is stopped. Then, the upper wafer $W_U$ sequentially drops onto the lower wafer $W_L$ and comes into contact with the lower wafer $W_L$. The bonding between the front surfaces $W_{U1}$ and $W_{L1}$ by a van der Waals and a hydrogen bond is successively expanded. In this way, the front surface $W_{U1}$ of the upper wafer $W_U$ and the front surface $W_{L1}$ of the lower wafer $W_L$ are brought into contact with each other over the entire surfaces, whereby the upper wafer $W_U$ and the lower wafer $W_L$ are bonded (step S13 in FIG. 10). At this time, the bonding wave becomes uniform. It is therefore possible to suppress the distortion of the laminated wafer $W_T$.

In step S13, the bonding area A is detected using the eight sensors 175, the bonding wave is monitored to inspect the bonding state between the upper wafer $W_U$ and the lower wafer $W_L$. As described above, in the present embodiment, the suction timings of the second suction portions 173 are set in advance so that the bonding wave becomes uniform. However, there may be a case where the bonding wave becomes non-uniform due to various disturbances. In such a case, an alarm is triggered, which makes it possible to improve the yield of products. In addition, if the bonding wave becomes non-uniform as described above, the suction timings of the second suction portions 173 when bonding the subsequent upper wafer $W_U$ and the subsequent lower wafer $W_L$ are corrected based on the detection result of the sensors 175.

Figure 15:
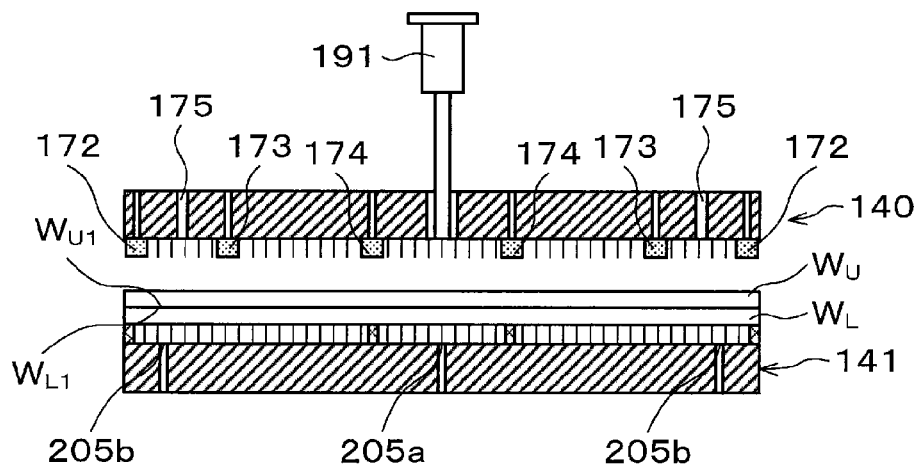
FIG. 15 is an explanatory view showing a state in which an upper wafer and a lower wafer are bonded.

Thereafter, as shown in FIG. 15, the actuator part 191 of the pressing member 190 is raised up to the upper chuck 140. Furthermore, the operations of the vacuum pumps 207a and 207b are stopped, the vacuum-drawing of the lower wafer $W_L$ in the suction region 204 is stopped so that the adsorptive holding of the lower wafer $W_L$ by the lower chuck 141 is stopped.

The laminated wafer $W_T$ obtained by bonding the upper wafer $W_U$ and the lower wafer $W_L$ is transferred to the transition device 51 by the wafer transfer device 61 and is then transferred to the cassette $C_T$ mounted on the predetermined cassette mounting plate 11 by the wafer transfer device 22 of the loading/unloading station 2. In this way, a series of bonding processes of the wafers $W_U$ and $W_L$ is completed.

According to the above-described embodiment, the sensors 175 can detect that the upper wafer $W_U$ held by the upper chuck 140 is detached from the upper chuck 140. This makes it possible to grasp the bonding wave. Then, the control part 70 controls the suction timings of the second suction portions 173 based on the detection result of the sensors 175. As a result, the bonding wave can be made uniform, which makes it possible to suppress the distortion of the laminated wafer $W_T$.

The bonding system 1 according to the present embodiment includes the surface modifying apparatus 30, the surface hydrophilizing apparatus 40 and the bonding apparatus 41. Thus, it is possible to efficiently bond the wafers $W_U$ and $W_L$ in a single system. Therefore, it is possible to improve the throughput of the wafer bonding process.

4. Other Embodiments

Next, other embodiments of the present disclosure will be described.

In the upper chuck 140 according to the above embodiment, the sensors 175 have been described to be disposed side by side between the first suction portions 172 and the second suction portions 173 in a concentric relationship with the main body part 170 at predetermined intervals in the circumferential direction. However, the arrangement of the sensors 175 is not limited thereto.

Figure 16:
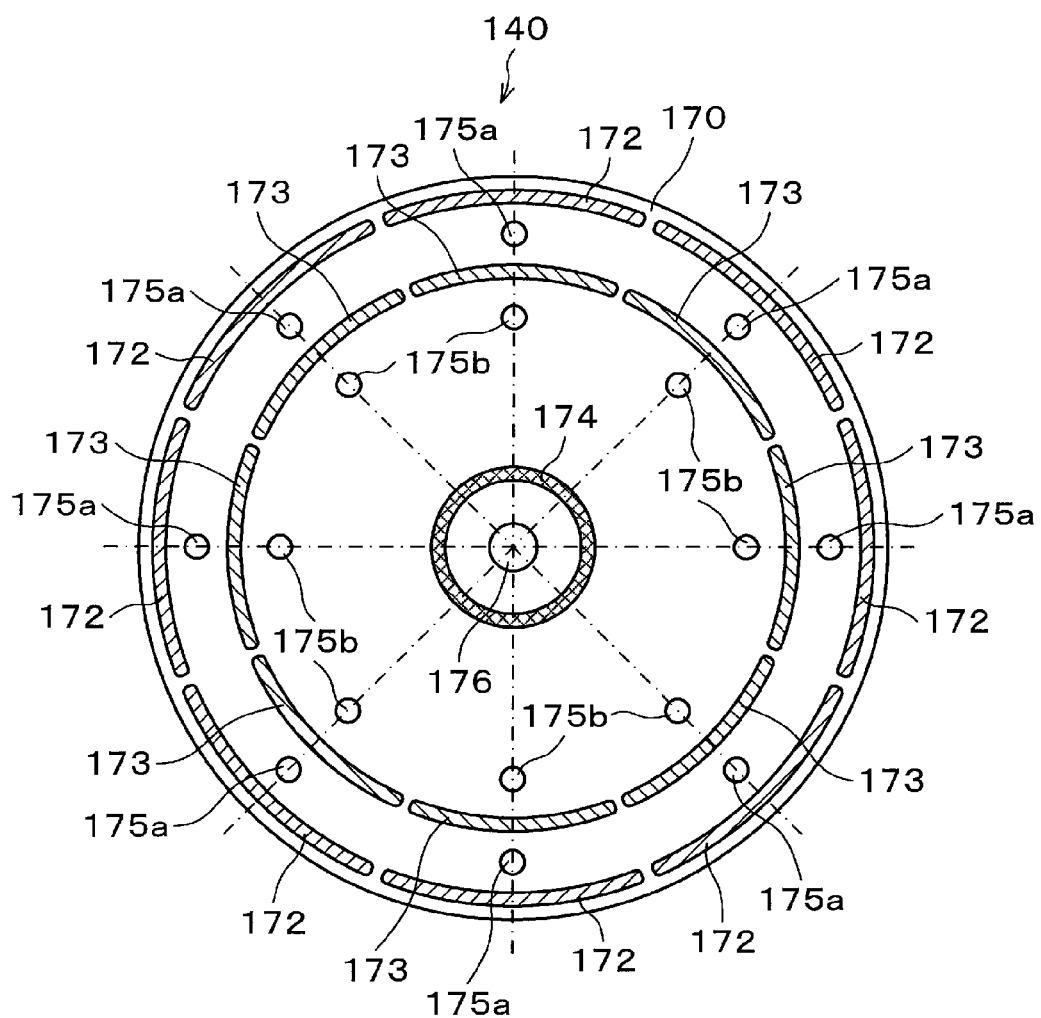
FIG. 16 is a plan view of an upper chuck, which shows an arrangement of sensors according to another embodiment.

As shown in FIG. 16, in addition to the sensors 175 provided between the first suction portions 172 and the second suction portions 173, a plurality of, for example, eight, sensors 175 may be arranged side by side at the inner peripheral side of the main body part 170 inward of the second suction portions 173 in a concentric relationship with the main body part 170 at predetermined intervals in the circumferential direction. That is to say, one set of paired sensors 175, the central portion of the first suction portion 172 and the central portion of the second suction portion 173 are arranged along the central line of the main body part 170. In the following description, the sensors 175 arranged between the first suction portions 172 and the second suction portions 173 are referred to as "sensors 175a". The sensors 175 arranged at the inner peripheral side of the second suction portions 173 are referred to as "sensors 175b".

In this case, the suction timings of the second suction portions 173 lying on the same central line as the sensors 175b can be controlled based on the detection result of the sensors 175b. Accordingly, it is possible to perform feedforward control of the second suction portions 173 in real time and to make the bonding wave uniform in a more reliable manner.

In some embodiments, the sensors 175a may be omitted and only the sensors 175b may be provided. However, since the sensor 175a are disposed away from the central portion of the main body part 170, it is possible for the sensors 175a to more reliably grasp the non-uniform expansion of the bonding area A than the sensors 175b. Specifically, for example, when the diameter of the upper wafer $W_U$ is 300 mm, the sensors 175a may be arranged beyond the diameter of 240 mm from the central portion of the main body part 170.

As shown in FIG. 8, in the related art, the bonding area A is expanded in a substantially quadrilateral shape. Taking into consideration the symmetry of expansion of the bonding area A, the number of sensors 175 may be reduced.

Figure 17A:
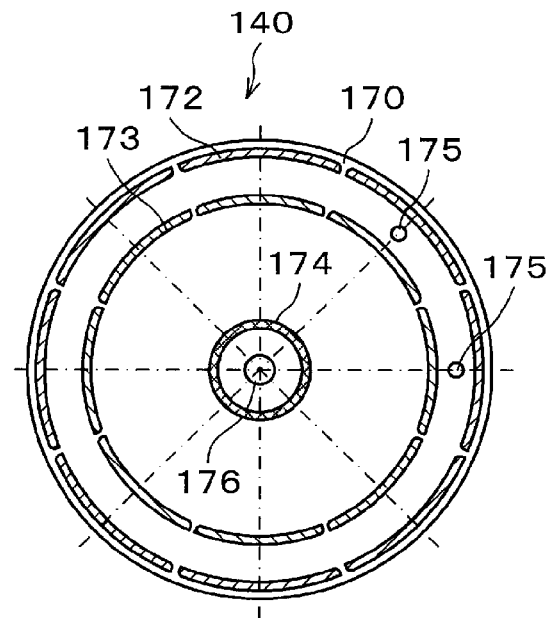
FIGS. 17A to 17D are plan views of an upper chuck, which shows arrangements of sensors according to other embodiments.
Figure 17B:
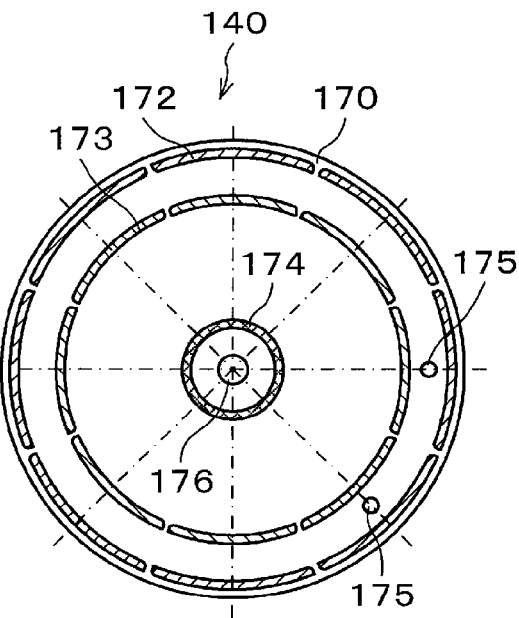
Figure 17C:
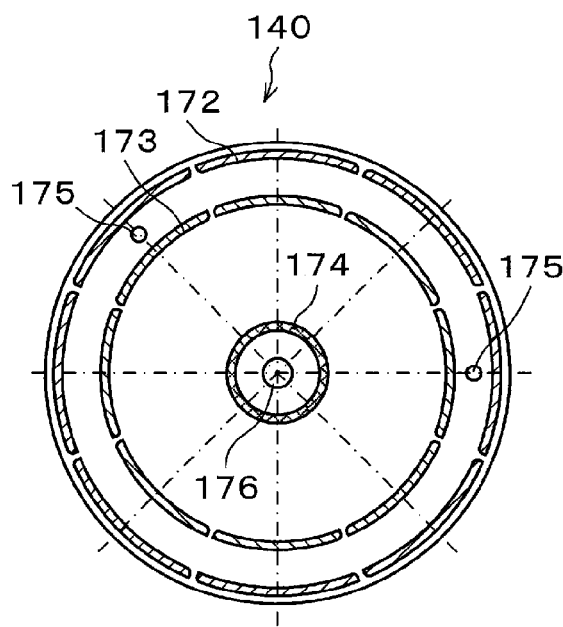
Figure 17D:
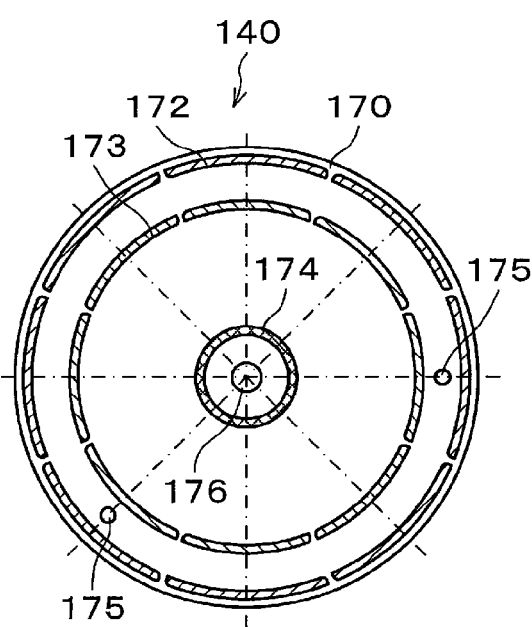
Figure 18:
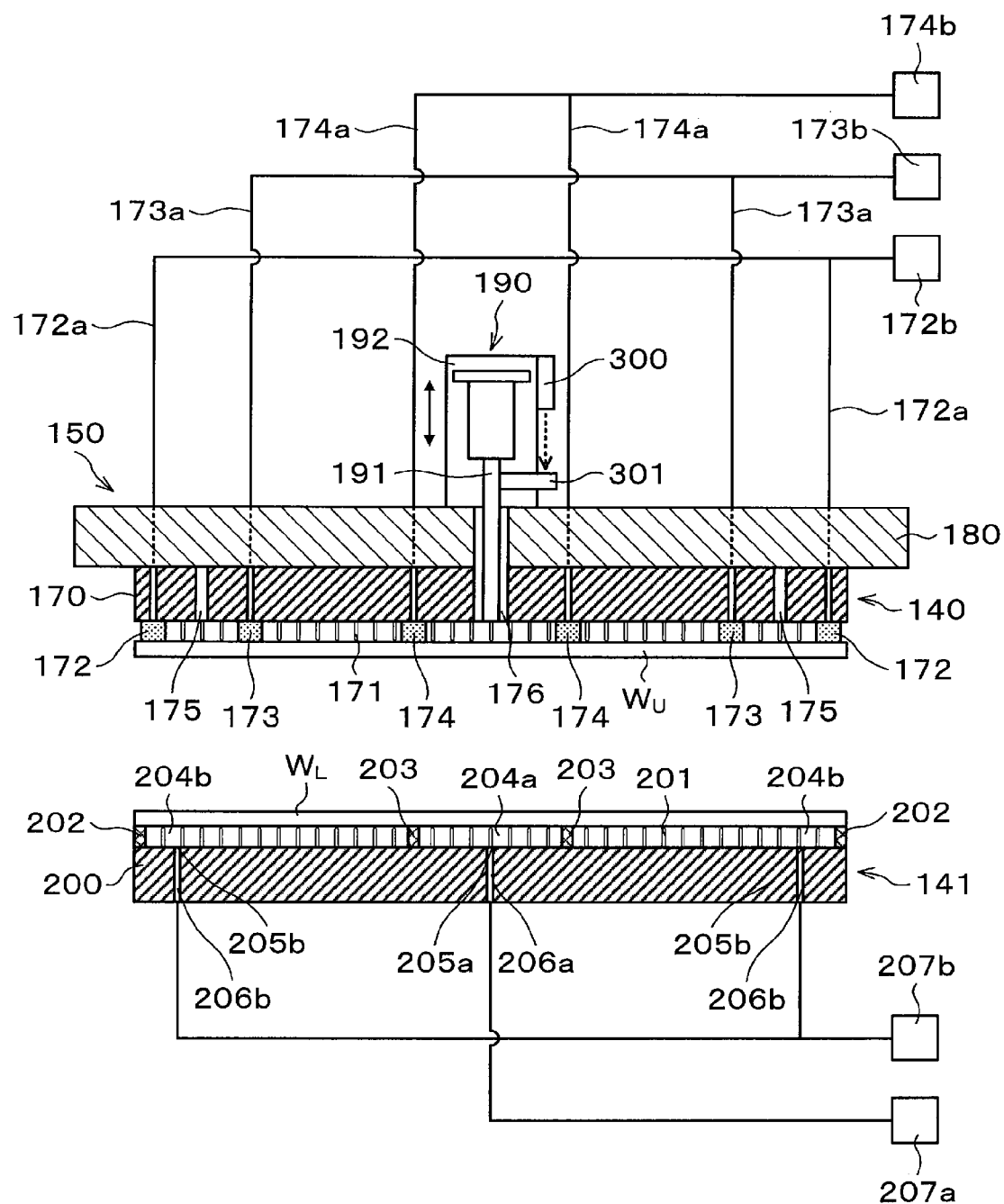
FIG. 18 is a vertical sectional view schematically showing configurations of an upper chuck, an upper chuck holding portion, and a lower chuck according to another embodiment.

For example, as shown in FIGS. 17A and 17B, two sensors 175 may be arranged in a line on the circumference of the main body part 170. That is to say, the sensors 175 may be disposed at least in each of the 45° directions and each of the 90° directions, respectively. In such a case, the sensor 175 disposed in one of the 45° directions may be used to estimate the expansion of the bonding area A in other 45° directions, and the sensor 175 disposed in one of the 90° directions may be used to estimate the expansion of the bonding area A in other 90° directions.

However, if the sensors 175 are provided over the entire circumference of the main body part 170 as shown in FIG. 7, it is possible to grasp the size of the gap between the upper wafer $W_U$ and the lower wafer $W_L$. In this regard, the upper wafer $W_U$ and the lower wafer $W_L$ are not precisely parallel but may be inclined by a minute distance, for example several μm. In this case, as the distance between the upper wafer $W_U$ and the lower wafer $W_L$ grows larger, air more easily escapes to the outside. Thus, the bonding area A expands rapidly. Even if there is a difference in expansion of the bonding area A, if the sensors 175 are provided on the entire circumference of the main body part 170, it is possible to appropriately grasp the bonding wave.

In the above embodiment, the contact state between the upper wafer $W_U$ and the lower wafer $W_L$ is detected using the sensors 175, thereby grasping the bonding wave. In some embodiments, the displacement of the actuator part 191 may be measured to grasp the bonding wave. As shown in FIG. 19, the pressing member 190 is provided with a laser displacement meter 300. The laser displacement meter 300 measures the displacement of a target 301 provided in the actuator part 191, thereby measuring the displacement of the actuator part 191.

In such a case, in step S12 (FIG. 12) of the above embodiment, when the actuator part 191 of the pressing member 190 is lowered, the displacement of the actuator part 191 is measured by the laser displacement meter 300. When the displacement measured by the laser displacement meter 300 reaches a predetermined threshold value, it is detected that the central portion of the upper wafer $W_U$ and the central portion of the lower wafer $W_L$ are in contact with each other.

The start of the bonding area A can be grasped on the basis of the measurement result obtained by the laser displacement meter 300 in this manner. It is therefore possible to more appropriately grasp the bonding wave. It is also possible to control the suction timings of the suction portions 172 to 174 on the basis of the measurement result obtained by the laser displacement meter 300.

The displacement meter provided in the pressing member 190 is not limited to the laser displacement meter 300 but may be arbitrarily selected as long as it can measure the displacement of the actuator part 191.

In the upper chuck 140 of the above embodiment, the single second vacuum pump 173b has been described to be connected to each of the eight second suction portions 173. Alternatively, a plurality of second vacuum pumps 173b may be provided to collectively control the operations of the second suction portions 173 on a group basis. For example, a first group of the second suction portions 173 disposed in four 45° directions may be controlled by one second vacuum pump 173b. Furthermore, a second group of the second suction portions 173 disposed in four 90° directions may be controlled by other second vacuum pumps 173b.

Similarly, with respect to the eight first suction portions 172, a plurality of first vacuum pumps 172b may be provided to collectively control the operations of the first suction portions 172 on a group basis.

The number and arrangement of the suction portions 172 to 174 are not limited to the example shown in FIG. 7. In the main body part 170, the number of suction portions on the same circumference may be a number other than eight. Furthermore, in the main body part 170, the suction portions may be provided in three or more rows.

In the bonding apparatus 41 of the above embodiment, the lower chuck 141 is configured to be movable in the horizontal direction. However, the upper chuck 140 may be configured to be movable in the horizontal direction, or both the upper chuck 140 and the lower chuck 141 may be configured to be movable in the horizontal direction.

In addition, in the bonding apparatus 41 of the above embodiment, the lower chuck 141 is configured to be movable in the vertical direction. However, the upper chuck 140 may be configured to be movable in the vertical direction, or both the upper chuck 140 and the lower chuck 141 may be configured to be movable in the vertical direction.

Furthermore, in the bonding apparatus 41 of the above embodiment, the lower chuck 141 is configured to be rotatable. However, the upper chuck 140 may be configured to be rotatable, or both the upper chuck 140 and the lower chuck 141 may be configured to be rotatable.

In the bonding system 1 of the above embodiment, after the wafers $W_U$ and $W_L$ are bonded by the bonding apparatus 41, the laminated wafer $W_T$ obtained by the bonding may be heated (annealed) at a predetermined temperature. By performing such a heat treatment on the laminated wafer $W_T$, it is possible to firmly bond the bonding interface.

Although the preferred embodiments of the present disclosure have been described above with reference to the accompanying drawings, the present disclosure is not limited to such embodiments. It will be apparent to those skilled in the art that various modifications or changes may be conceived within the scope of the idea described in the claims. It is to be understood that such modifications or changes naturally fall within the technical scope of the present disclosure. The present disclosure is not limited to these embodiments but may take various forms. The present disclosure may also be applied to a case where the substrate is a substrate other than the wafer, such as an FPD (flat panel display), a mask reticle for a photomask or the like.

According to the present disclosure in some embodiments, a substrate detection part can detect that a first substrate held by a first holding part is detached from the first holding part. When the first substrate is detached, the first substrate is dropped down and brought into contact with a second substrate. The first substrate and the second substrate are bonded by virtue of an intermolecular force. Accordingly, by detecting the detachment of the first substrate, it is possible to grasp a bonding wave and to inspect a state of the bonding process of the substrates. Further, for example, if the bonding wave is uniform (the state of the bonding process is normal), the bonding process may be continuously performed. On the other hand, for example, if the bonding wave is non-uniform (the state of the bonding process is abnormal), the bonding process may be performed by correcting a process condition. Therefore, according to the present disclosure, it is possible to appropriately perform the bonding process According to the present disclosure in some embodiments, it is possible to inspect a state of a bonding process of substrates and to appropriately perform the bonding process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A bonding apparatus that performs a bonding process of bonding substrates together, comprising:
    a first holding part configured to adsorptively hold a first substrate on a lower surface of the first holding part;
    a second holding part provided below the first holding part and configured to adsorptively hold a second substrate on an upper surface of the second holding part;
    a pressing member provided in the first holding part and configured to press a central portion of the first substrate;
    a substrate detection part arranged inward of a periphery of the first substrate and configured to detect a bonding area between the first substrate and the second substrate; and
    a controller configured to control, based on an elapsed time of the bonding process and a detection result of the substrate detection part, a timing at which the first holding part releases the first substrate, so that expansion of the bonding area is made uniform.

2. The bonding apparatus of claim 1, wherein the controller is further configured to control a time difference between a timing at which the bonding area is reached in a direction from the central portion of the first substrate toward the periphery of the first substrate and a timing at which the bonding area is reached in another direction from the central portion of the first substrate toward the periphery of the first substrate, so that the time difference falls within a predetermined threshold value.

3. The bonding apparatus of claim 1, wherein the controller is further configured to detect the expansion of the bonding area by the substrate detection part with respect to the first substrate of a previous lot, and configured to control, based on the detection result, a timing at which the first holding part releases the first substrate of a current lot.

4. The bonding apparatus of claim 1, wherein the substrate detection part includes a plurality of substrate detectors provided along a circumference.

5. The bonding apparatus of claim 1, wherein the substrate detection part includes a plurality of substrate detectors provided along a plurality of circumferences.

6. The bonding apparatus of claim 1, wherein the first holding part includes a plurality of suction portions configured to make contact with the first substrate and to adsorb the first substrate by vacuum-drawing the first substrate, and
wherein the controller is further configured to control the plurality of suction portions based on the detection result of the substrate detection part.

7. A bonding system provided with the bonding apparatus of claim 1, comprising:
a processing station provided with the bonding apparatus; and
a loading/unloading station configured to hold a plurality of first substrates, a plurality of second substrates or a plurality of laminated substrates each of which is obtained by bonding the first substrate and the second substrate, and configured to load and unload the plurality of first substrates, the plurality of second substrates or the plurality of laminated substrates into and from the processing station,
wherein the processing station includes:
a surface modifying apparatus configured to modify a surface of the first substrate or the second substrate to be bonded;
a surface hydrophilizing apparatus configured to hydrophilize the surface of the first substrate or the surface of the second substrate modified by the surface modifying apparatus; and
a transfer device configured to transfer the plurality of first substrates, the plurality of second substrates or the plurality of laminated substrates to the surface modifying apparatus, the surface hydrophilizing apparatus and the bonding apparatus, and
wherein the bonding apparatus is configured to bond the first substrate and the second substrate whose surfaces are hydrophilized by the surface hydrophilizing apparatus.

8. A bonding method for bonding substrates together, comprising:
arranging a first substrate held on a lower surface of a first holding part and a second substrate held on an upper surface of a second holding part so as to face each other;
subsequently, lowering a pressing member provided in the first holding part and configured to press a central portion of the first substrate, and causing the pressing member to press and bring the central portion of the first substrate and a central portion of the second substrate into contact with each other; and
subsequently, sequentially bonding the first substrate and the second substrate from the central portion of the first substrate toward an outer peripheral portion of the first substrate in a state in which the central portion of the first substrate and the central portion of the second substrate are in contact with each other,
wherein the bonding the first substrate and the second substrate includes: detecting a bonding area between the first substrate and the second substrate, using a substrate detection part arranged inward of a periphery of the first substrate; and controlling, based on an elapsed time of the bonding the first substrate and the second substrate and a detection result of the substrate detection part, a timing at which the first holding part releases the first substrate, so that expansion of the bonding area is made uniform.

9. The bonding method of claim 8, wherein the bonding the first substrate and the second substrate further includes controlling a time difference between a timing at which the bonding area is reached in a direction from the central portion of the first substrate toward the periphery of the first substrate and a timing at which the bonding area is reached in another direction from the central portion of the first substrate toward the periphery of the first substrate, so that the time difference falls within a predetermined threshold value.

10. The bonding method of claim 8, wherein the bonding the first substrate and the second substrate further includes:
detecting the expansion of the bonding area by the substrate detection part with respect to the first substrate of a previous lot; and
controlling, based on the detection result, a timing at which the first holding part releases the first substrate of a current lot.

11. The bonding method of claim 8, wherein the substrate detection part includes a plurality of substrate detectors provided along a circumference.

12. The bonding method of claim 8, wherein the substrate detection part includes a plurality of substrate detectors provided along a plurality of circumferences.

13. The bonding method of claim 8, wherein the first holding part includes a plurality of suction portions configured to make contact with the first substrate and to adsorb the first substrate by vacuum-drawing the first substrate, and
wherein the bonding the first substrate and the second substrate further includes controlling the plurality of suction portions based on the detection result of the substrate detection part.

14. A non-transitory computer-readable storage medium storing a program that operates on a computer of a control part configured to control a bonding apparatus so that the bonding method of claim 8 is executed by the bonding apparatus.

* * * * *